US006981317B1

(12) United States Patent
Nishida

(10) Patent No.: US 6,981,317 B1
(45) Date of Patent: *Jan. 3, 2006

(54) METHOD AND DEVICE FOR MOUNTING ELECTRONIC COMPONENT ON CIRCUIT BOARD

(75) Inventor: Kazuto Nishida, Katano (JP)

(73) Assignee: Matsushita Electric Industrial Co., Ltd., Osaka-fu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/331,763

(22) PCT Filed: Dec. 26, 1997

(86) PCT No.: PCT/JP97/04873

§ 371 (c)(1),
(2), (4) Date: Jun. 25, 1999

(87) PCT Pub. No.: WO98/30073

PCT Pub. Date: Jul. 9, 1998

(30) Foreign Application Priority Data

Dec. 27, 1996 (JP) .................................. 8-350738

(51) Int. Cl.
*H01L 21/44* (2006.01)
(52) U.S. Cl. .......................................... 29/840; 438/118
(58) Field of Classification Search ................ 29/832, 29/840, 759, 739, 740, 841; 257/775; 438/118
See application file for complete search history.

(56) References Cited

U.S. PATENT DOCUMENTS

| | | | | |
|---|---|---|---|---|
| 3,777,220 A | * | 12/1973 | Tatusko et al. | 174/255 |
| 3,811,186 A | * | 5/1974 | Larnerd et al. | 29/840 |
| 3,909,680 A | * | 9/1975 | Tsunashima | 156/90 |
| 3,936,575 A | * | 2/1976 | Watanabe et al. | 156/330 |
| 4,731,282 A | * | 3/1988 | Tsukagoshi et al. | 428/220 |
| 4,740,657 A | * | 4/1988 | Tsukagoshi et al. | 174/88 R |
| 4,825,284 A | | 4/1989 | Soga et al. | |

(Continued)

FOREIGN PATENT DOCUMENTS

DE     195 35 282 A1    3/1996

(Continued)

OTHER PUBLICATIONS

Merriam-Webster's Collegiate Dictionary, Tenth edition, 1997, p. 1118, definition of solid.*

(Continued)

*Primary Examiner*—Joseph C. Merek
(74) *Attorney, Agent, or Firm*—Wenderoth, Lind & Ponack, L.L.P.

(57) ABSTRACT

When mounting an IC chip on a circuit board, bumps are formed on electrodes of the IC chip, and the bumps and the electrodes of the circuit board are aligned in position with each other with interposition of an insulative thermosetting resin having no conductive particle between the electrodes of the circuit board and the bumps. The IC chip is pressed against the circuit board with a pressure force of not smaller than 20 gf per bump by a heated head so as to perform warp correction of the IC chip and the board, while the resin interposed between the IC chip and the circuit board is hardened to bond the IC chip and the circuit board together.

28 Claims, 18 Drawing Sheets

U.S. PATENT DOCUMENTS

| | | | | |
|---|---|---|---|---|
| 4,860,087 A | * | 8/1989 | Matsubara et al. | 257/786 |
| 4,963,002 A | * | 10/1990 | Tagusa et al. | 349/149 |
| 4,967,950 A | * | 11/1990 | Legg et al. | 228/180.22 |
| 4,995,156 A | * | 2/1991 | Pinnavaia | 29/838 |
| 5,001,542 A | * | 3/1991 | Tsukagoshi et al. | 257/746 |
| 5,040,069 A | * | 8/1991 | Matsumoto et al. | 348/76 |
| 5,071,787 A | * | 12/1991 | Mori et al. | 29/840 |
| 5,090,119 A | * | 2/1992 | Tsuda et al. | 29/843 |
| 5,232,532 A | * | 8/1993 | Hori | 156/163 |
| 5,303,862 A | | 4/1994 | Bross et al. | |
| 5,384,952 A | * | 1/1995 | Matsui | 29/840 |
| 5,386,624 A | | 2/1995 | George et al. | |
| 5,447,886 A | | 9/1995 | Rai | |
| 5,485,949 A | | 1/1996 | Tomura et al. | |
| 5,508,561 A | | 4/1996 | Tago et al. | |
| 5,651,179 A | * | 7/1997 | Bessho et al. | 29/832 |
| 5,699,611 A | * | 12/1997 | Kurogi et al. | 29/840 |
| 5,704,116 A | * | 1/1998 | Gamota et al. | 29/840 |
| 5,745,986 A | * | 5/1998 | Variot et al. | 29/840 |
| 5,749,997 A | * | 5/1998 | Tang et al. | 156/240 |
| 5,801,350 A | * | 9/1998 | Shibuya et al. | 204/157.15 |
| 5,843,251 A | * | 12/1998 | Tsukagoshi et al. | 156/64 |
| 5,848,466 A | * | 12/1998 | Viza et al. | 29/840 |
| 5,859,470 A | * | 1/1999 | Ellerson et al. | 257/772 |
| 5,860,212 A | * | 1/1999 | Matsuhira | 28/840 |
| 5,874,780 A | * | 2/1999 | Murakami | 257/775 |
| 5,930,889 A | * | 8/1999 | Klein | 29/840 |
| 5,953,814 A | * | 9/1999 | Sozansky et al. | 29/840 |
| 6,000,127 A | * | 12/1999 | Eifuku et al. | 29/840 |
| 6,006,426 A | * | 12/1999 | Kira et al. | 29/836 |
| 6,011,313 A | * | 1/2000 | Shangguan et al. | 257/778 |
| 6,022,761 A | * | 2/2000 | Grupen-Shemansky et al. | 438/125 |
| 6,326,241 B1 | * | 12/2001 | Belke et al. | 438/118 |

FOREIGN PATENT DOCUMENTS

| | | |
|---|---|---|
| DE | 19535282 | 3/1996 |
| EP | 0 475 022 A1 | 3/1992 |
| JP | 60-262430 | 12/1985 |
| JP | 62-6652 | 2/1987 |
| JP | 62-188184 | 8/1987 |
| JP | 2-54932 | 2/1990 |
| JP | 2-155257 | 6/1990 |
| JP | 4-169001 | 6/1992 |
| JP | 4-280443 | 10/1992 |
| JP | 4-351863 | 12/1992 |
| JP | 4-363811 | 12/1992 |
| JP | 5-29392 | 2/1993 |
| JP | 5-206208 | 8/1993 |
| JP | 6-37144 | 2/1994 |
| JP | 6-66355 | 8/1994 |
| JP | 6-240217 | 8/1994 |
| JP | 7-321148 | 12/1995 |
| JP | 8-37208 | 2/1996 |
| JP | 8-88462 | 4/1996 |
| JP | 8-162498 | 6/1996 |
| JP | 8-185713 | 7/1996 |
| JP | 9-97816 | 4/1997 |

OTHER PUBLICATIONS

Gijutsu Joho Kyokai, "Bare Chip Mounting centering COB and TOB mounting—latest technology development and reliability measures—", Jan. 31, 1990.

"Flip Chip Technologies" issued by McGraw-Hill and edited by John H. Lau (published date is unknown), but "TK7874. F5897 1995" and "Copyright (c) 1996" are included.

* cited by examiner

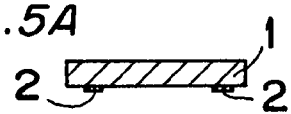
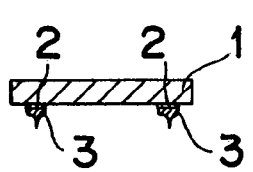
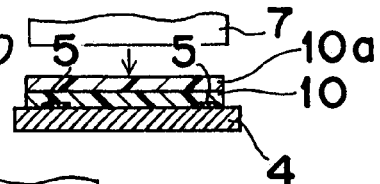
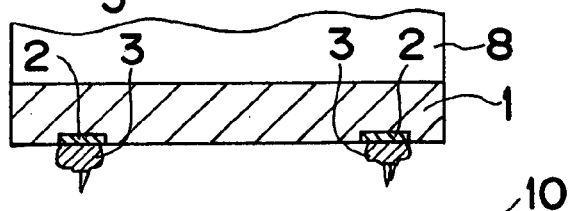
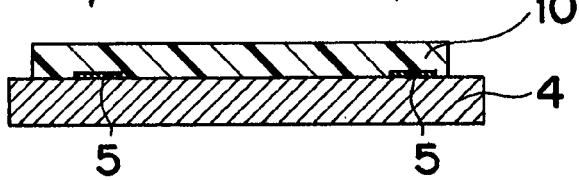
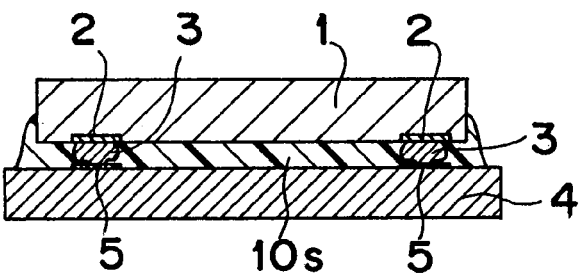
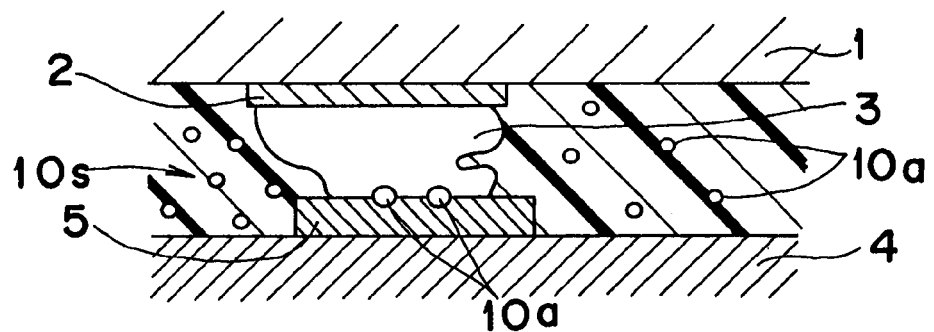

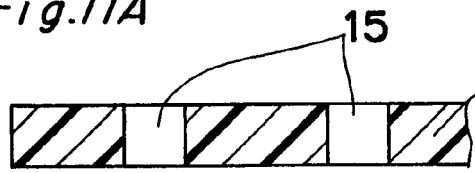
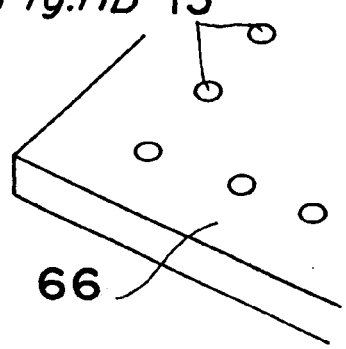
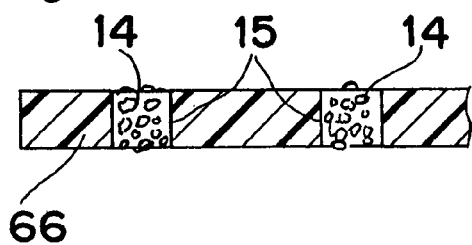
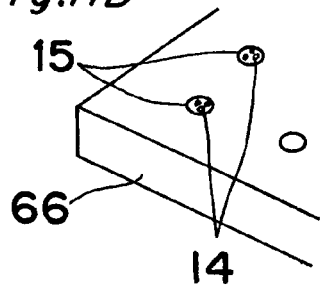
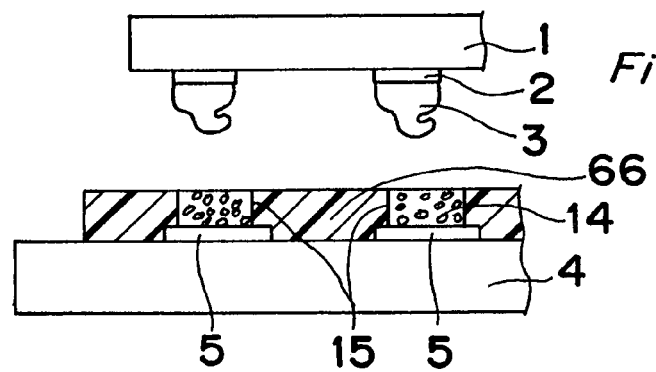
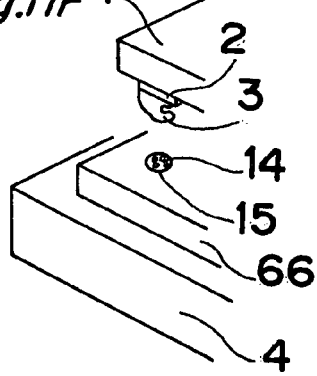
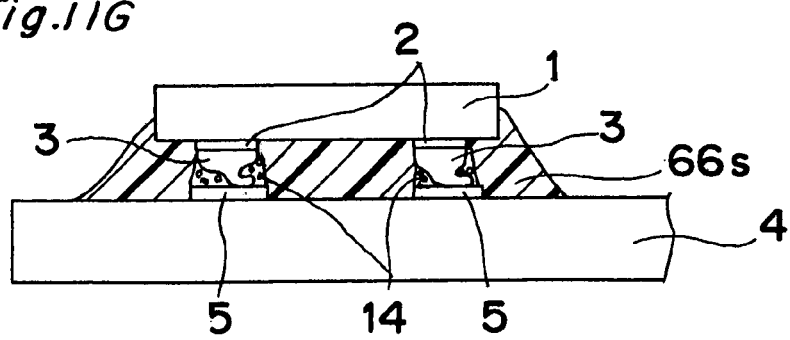

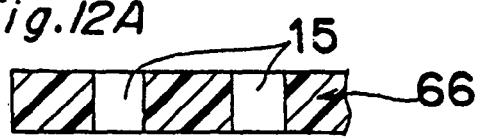
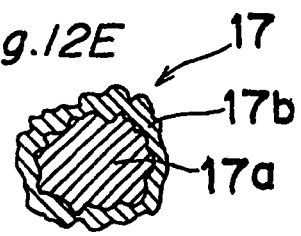
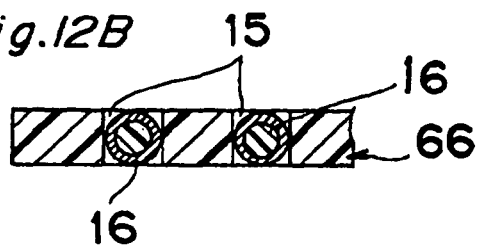
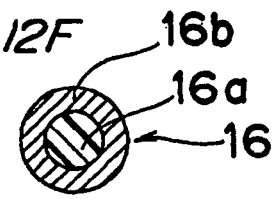
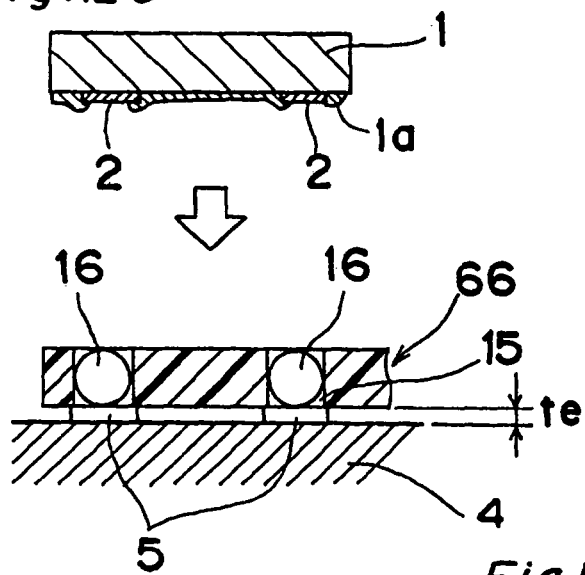
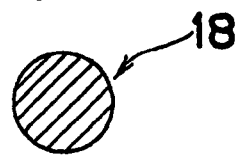
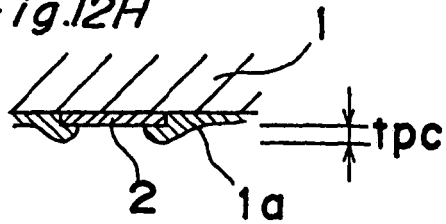
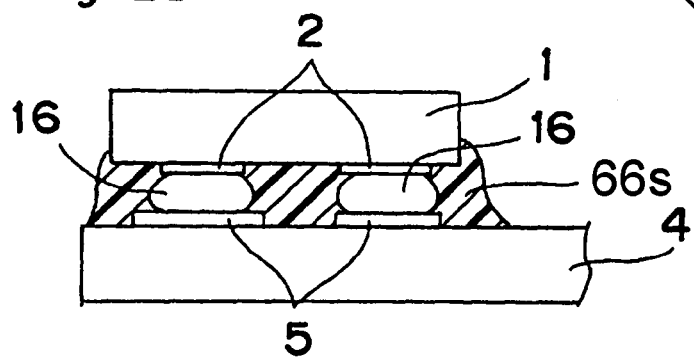

METHOD AND DEVICE FOR MOUNTING ELECTRONIC COMPONENT ON CIRCUIT BOARD

TECHNICAL FIELD

The present invention relates to a method and apparatus for mounting an electronic component on a circuit board, i.e. for mounting an electronic component such as an IC chip and a surface acoustic wave (SAW) device singly (in the form of a bare IC in the case of the IC chip) on a printed circuit board to be used for an electronic circuit.

BACKGROUND ART

Nowadays, electronic circuit boards are employed in a variety of products, and they are improving in performance day by day. The frequencies to be used on the circuit boards are also increasing, and accordingly, the flip-chip mounting that ensures low impedance is the appropriate mounting method suitable for electronic devices that use high frequencies. In accordance with an increase in number of portable devices, the flip-chip mounting for mounting IC chips in the bare chip form, not in the package form, on a circuit board is needed. For this reason, the IC chips that are singly mounted on circuit boards and IC chips mounted on electronic devices and flat panel display units include a certain number of defectives. Besides the above-mentioned flip-chip components, an increasing number of components of CSP (Chip Size Package), BGA (Ball Grid Array), and the like have come to be used.

As a conventional method (first prior art example) for bonding an IC chip to the circuit board of an electronic device, there is the one disclosed in Japanese Examined Patent Publication No. 06-66355. This is shown in FIG. 13. As shown in FIG. 13, there is generally known the method for transferring Ag paste 74 onto bumps 73 formed on an IC chip 71, connecting the Ag paste 74 to electrodes 75 of a circuit board 76, thereafter hardening the Ag paste 74 and then pouring an encapsulation material 78 in a space between the IC chip 71 and the circuit board 76.

As a method (second prior art example) for bonding an IC chip to a liquid crystal display, there is generally known a semiconductor chip connecting structure that uses an anisotropic conductive film 80 as disclosed in Japanese Examined Patent Publication No. 62-6652 shown in FIGS. 14A–14B. In such structure, an anisotropic conductive adhesive layer 81 constructed by incorporating conductive particles 82 into an insulative resin 83 is peeled off a separator 85 and coated on a substrate or a glass plate of a liquid crystal display 84. By thermocompression bonding an IC chip 86, the anisotropic conductive adhesive layer 81 is interposed between the lower surface of the IC chip 86 and substrate 84 except for portions below Au bumps 87.

As a third prior art example, there is known a method for coating a UV hardening resin on a substrate, mounting an IC chip on the substrate and applying ultraviolet rays to the resin with pressure, thereby hardening the resin between the IC chip and the substrate and maintaining contact between the two by the shrinkage force of the resin.

As described above, the bonding of an IC chip has been performed by die-bonding an IC chip such as a flat package onto a lead frame, connecting the electrodes of the IC chip to the lead frame by wire-bonding, forming a package by resin molding, thereafter printing solder paste on a circuit board, mounting the flat package IC on the board, and performing reflow of the paste. According to the above processing method called SMT (Surface Mount Technology), it has been difficult to reduce the circuit board size due to a long process and much time consumed for production. For example, an IC chip occupies an area about four times that of the IC chip when encapsulated in a flat package, and this has been a factor for hindering the reduction in size.

In contrast to this, the flip chip processing method of directly mounting an IC chip in bare chip form has come to be more frequently used lately for the achievement of a reduction of processing and a small-size light-weight structure. This flip chip processing method has been developed with many forms such as stud bump bonding (SBB) for executing bump formation on an IC chip, bump leveling, Ag.Pd paste transfer, mounting, inspection, encapsulation with encapsulation resin, and inspection and UV resin bonding for simultaneously executing bump formation on an IC chip and UV hardening resin coating on the board and thereafter executing mounting, UV hardening of the resin, and inspection.

However, each of such methods has had the drawback that much time is taken for the hardening of the paste for connecting the bumps of the IC chip with the electrodes of the board and for the coating and hardening of the encapsulation resin, leading to degraded productivity. It is further required to use ceramic or glass for the circuit board, and this has disadvantageously led to a high cost. According to the method for using conductive paste as in the first prior art example as a bonding material, the bumps of the IC chip have been required to be subjected to leveling so as to be flattened before use, in order to stabilize the transfer mount.

For the bonding structure using the anisotropic conductive adhesive as in the second prior art example, a structure that uses glass as a base material of the circuit board is developed. However, it is difficult to uniformly disperse the conductive particles in the conductive adhesive, and this has caused shortcircuits due to abnormal dispersion of the particles and led to the expense of the conductive adhesive.

The bonding method using the UV hardening resin as in the third prior art example has had the problem that the variation in height of the bumps must be suppressed within ±1 ($\mu$m) and the issue that the method cannot achieve connection to a board having a degraded flatness such as a resin board (glass epoxy board). The method using solder has been required to pour and harden the encapsulation resin for alleviating the difference between thermal expansion and contraction of the board and the IC chip after the bonding. This resin encapsulation needs two to four hours, and this has led to the issue that the productivity is significantly low.

In view of the aforementioned conventional issues, the present invention has an object to provide a method and apparatus for mounting an IC chip on a circuit board, intended for bonding the IC chip to the board with high productivity and high reliability necessitating neither the resin encapsulation process for pouring resin in the space between the IC chip and the board after the bonding of the IC chip to the circuit board nor the bump leveling process for adjusting the bump height constant.

Also, in view of the aforementioned conventional issues, the present invention has another object to provide a method and apparatus for mounting an electronic component on a circuit board, intended for directly bonding the electronic component on the circuit board with high productivity.

SUMMARY OF INVENTION

The present invention is constructed as follows to solve the aforementioned issues.

According to a first aspect of the present invention, there is provided an electronic component mounting method comprising:

aligning in position electrodes of a circuit board with bumps formed by wire-bonding on electrodes of an electronic component with interposition of an insulative thermosetting resin that includes no conductive particles; and hardening with heat the thermosetting resin interposed between the electronic component and the circuit board while correcting warp of the board by pressurizing the electronic component against the circuit board with a pressure force of not smaller than 20 gf per bump, thereby bonding the electronic component and the circuit board together for electrical connection between both the electrodes thereof.

According to a second aspect of the present invention, there is provided an electronic component mounting method according to the first aspect, wherein the positional alignment is executed by aligning in position the electrodes of the circuit board with the bumps formed by wire-bonding on the electrodes of the electronic component with interposition of the thermosetting resin without performing leveling, and the bonding is executed by hardening with the heat the thermosetting resin interposed between the electronic component and the circuit board while simultaneously performing leveling of the bumps and correction of the warp of the board by pressurizing the electronic component against the circuit board with the pressure force of not smaller than 20 gf per bump, thereby bonding the electronic component and the circuit board together for electrical connection between both the electrodes thereof.

According to a third aspect of the present invention, there is provided an electronic component mounting method according to the first or second aspect, wherein the thermosetting resin is a thermosetting resin sheet having an anisotropic conductive film.

According to a fourth aspect of the present invention, there is provided an electronic component mounting method according to the first aspect, wherein the positional alignment is executed after a solid thermosetting resin sheet having a shape dimension smaller than an outside dimension of connection between the electrodes of the electronic component is stuck as the thermosetting resin to the circuit board before the positional alignment, and the bonding is executed by hardening with the heat the thermosetting resin sheet interposed between the electronic component and the circuit board while simultaneously performing the correction of the warp of the circuit board by pressurizing the electronic component against the circuit board with the heat applied to the thermosetting resin sheet, thereby bonding the electronic component and the circuit board together.

According to a fifth aspect of the present invention, there is provided an electronic component mounting method according to the first aspect, wherein a conductive adhesive is transferred onto the bumps of the electrodes of the electronic component before the positional alignment, the positional alignment of the bumps with the electrodes of the circuit board is executed after a solid thermosetting resin sheet having a shape dimension smaller than an outside dimension of connection between the electrodes of the electronic component is stuck as the thermosetting resin to the circuit board before the positional alignment, and the bonding is executed by hardening with the heat the thermosetting resin sheet interposed between the electronic component and the circuit board while simultaneously performing the correction of the warp of the circuit board by pressurizing the electronic component against the circuit board with the heat applied to the thermosetting resin sheet, thereby bonding the electronic component and the circuit board together.

According to a sixth aspect of the present invention, there is provided an electronic component mounting method according to the first aspect, wherein the positional alignment of the bumps of the electrodes of the electronic component with the electrodes of the circuit board is executed after a solid thermosetting resin sheet whose one surface or both surfaces are provided with a flux layer is stuck as the thermosetting resin to the circuit board, and the bonding is executed by hardening the thermosetting resin sheet interposed between the electronic component and the circuit board while simultaneously performing the correction of the warp of the circuit board by pressurizing the electronic component against the circuit board by a heated head, thereby bonding the electronic component and the circuit board together as a consequence of the bonding of the bumps to the electrodes of the circuit board due to adhesion of a flux component of the flux layer to the bumps occurring when the bumps break through the resin sheet.

According to a seventh aspect of the present invention, there is provided an electronic component mounting method according to the first aspect, wherein the positional alignment of the bumps of the electronic component with the electrodes of the circuit board is executed after a solid thermosetting resin sheet where particles comprised: of resin balls whose surfaces are plated with gold; or nickel particles; or conductive particles made of silver, silver-palladium, or gold; or a conductive paste; or gold balls are embedded in a direction in which the bumps and the electrodes of the circuit board are made mutually electrically continuous inside holes formed in positions corresponding to either the bumps of the electrodes of the electronic component or the electrodes of the circuit board before the positional alignment is stuck as the thermosetting resin to the electrodes of the circuit board through positional alignment, and the bonding is executed by hardening with heat the thermosetting resin sheet interposed between the electronic component and the circuit board while performing the correction of the warp of the circuit board by pressurizing the electronic component against the circuit board with the heat applied to the thermosetting resin sheet.

According to an eighth aspect of the present invention, there is provided an electronic component mounting method according to the first aspect, wherein the positional alignment of the electrodes of the electronic component with the electrodes of the circuit board is executed after a solid thermosetting resin sheet where particles each of which has a size that is greater than a thickness of a passivation film to be coated on at least the electrodes of the electronic component and smaller than a thickness of one of the electrodes of the circuit board and each of which is comprised of: resin balls whose surfaces are plated with gold; or nickel particles; or conductive particles made of silver, silver-palladium, or gold; or a conductive paste; or gold balls are embedded inside holes formed in positions corresponding to either of the electrodes of the electronic component or the electrodes of the circuit board in a direction in which the particles are interposed between the electrode of the electronic component and the circuit electrode of the circuit board and in which the electrodes are made mutually electrically continuous before the positional alignment is stuck as the thermosetting resin to the electrodes of the circuit board through positional alignment when mounting the electronic component on the circuit board, and the bonding is executed by hardening with the heat the thermosetting resin sheet interposed between the electronic component and the circuit board while pressurizing the electronic component against the circuit board with the heat applied to the thermosetting resin sheet and with ultrasonic vibrations applied to the electronic component.

According to a ninth aspect of the present invention, there is provided an electronic component mounting method according to the third aspect, wherein the conductive particles included in the anisotropic conductive film are nickel particles plated with gold.

According to a tenth aspect of the present invention, there is provided an electronic component mounting method according to any one of the first through ninth aspects, wherein the thermosetting resin is provided by a thermosetting resin sheet.

According to an eleventh aspect of the present invention, there is provided an electronic component mounting method according to the tenth aspect, wherein the thermosetting resin sheet has a thickness greater than a gap between an active surface of the electronic component and a surface which belongs to the circuit board and on which the electrodes thereof are formed after the bonding.

According to a twelfth aspect of the present invention, there is provided an electronic component mounting method according to the first or second aspect, wherein the thermosetting resin is provided by a thermosetting adhesive.

According to a thirteenth aspect of the present invention, there is provided an electronic component mounting apparatus comprising:

a positional alignment device for aligning in position electrodes of a circuit board with bumps formed by wire-bonding on electrodes of an electronic component with interposition of an insulative thermosetting resin that includes no conductive particle;

a heating device for heating the thermosetting resin; and a bonding device for hardening with heat the thermosetting resin interposed between the electronic component and the circuit board while correcting warp of the board by pressurizing the electronic component against the circuit board with a pressure force of not smaller than 20 gf per bump with the heat applied to the thermosetting resin from the heating device, thereby bonding the electronic component and the circuit board together for electrical connection between both the electrodes thereof.

According to a fourteenth aspect of the present invention, there is provided an electronic component mounting apparatus according to the thirteenth aspect, wherein the positional alignment device is to align in position the electrodes of the circuit board with the bumps formed by wire-bonding on the electrodes of the electronic component with interposition of the thermosetting resin without performing leveling, and the bonding device hardens with the heat the thermosetting resin interposed between the electronic component and the circuit board while simultaneously performing leveling of the bumps and correction of the warp of the board by pressurizing the electronic component against the circuit board with the pressure force of not smaller than 20 gf per bump with the heat applied to the thermosetting resin from the heating device, thereby bonding the electronic component and the circuit board together for electrical connection between both the electrodes thereof.

According to a fifteenth aspect of the present invention, there is provided an electronic component mounting apparatus according to the thirteenth or fourteenth aspect, wherein the thermosetting resin is a thermosetting resin sheet having an anisotropic conductive film.

According to a sixteenth aspect of the present invention, there is provided an electronic component mounting apparatus according to the thirteenth aspect, wherein the positional alignment device sticks a solid thermosetting resin sheet having a shape dimension smaller than an outside dimension of connection between the electrodes of the electronic component as the thermosetting resin to the circuit board, and thereafter executes positional alignment of the bumps of the electrodes of the electronic component with the electrodes of the circuit board, and the bonding device hardens with the heat the thermosetting resin sheet interposed between the electronic component and the circuit board while simultaneously performing the correction of the warp of the circuit board by pressurizing the electronic component against the circuit board with the heat applied to the thermosetting resin sheet, thereby bonding the electronic component and the circuit board together.

According to a seventeenth aspect of the present invention, there is provided an electronic component mounting apparatus according to the thirteenth aspect, wherein a conductive adhesive is transferred onto the bumps of the electrodes of the electronic component before the positional alignment, the positional alignment of the bumps with the electrodes of the circuit board is executed after a solid thermosetting resin sheet having a shape dimension smaller than an outside dimension of connection between the electrodes of the electronic component is stuck as the thermosetting resin to the circuit board before the positional alignment, and the bonding is executed by hardening with the heat the thermosetting resin sheet interposed between the electronic component and the circuit board while simultaneously performing the correction of the warp of the circuit board by pressurizing the electronic component against the circuit board with the heat applied to the thermosetting resin sheet, thereby bonding the electronic component and the circuit board together.

According to an eighteenth aspect of the present invention, there is provided an electronic component mounting apparatus according to the thirteenth aspect, wherein the positional alignment device sticks a solid thermosetting resin sheet whose one surface or both surfaces are provided with a flux layer as the thermosetting resin to the circuit board, and thereafter executes the positional alignment of the bumps of the electrodes of the electronic component with the electrodes of the circuit board, and the positional alignment device hardens the thermosetting resin sheet interposed between the electronic component and the circuit board while simultaneously performing the correction of the warp of the circuit board by pressurizing the electronic component against the circuit board by a heated head, thereby bonding the electronic component and the circuit board together as a consequence of the bonding of the bumps to the electrodes of the circuit board due to adhesion of a flux component of the flux layer to the bumps occurring when the bumps break through the resin sheet.

According to a nineteenth aspect of the present invention, there is provided an electronic component mounting apparatus according to the thirteenth aspect, wherein the positional alignment device sticks a solid thermosetting resin sheet where particles comprised of: resin balls whose surfaces are plated with gold; or nickel particles; or conductive particles made of silver, silver-palladium, or gold; or a conductive paste; or gold balls are embedded in a direction in which the bumps and the electrodes of the circuit board are made mutually electrically continuous inside holes formed in positions corresponding to either the bumps of the electrodes of the electronic component or the electrodes of the circuit board, to the electrodes of the circuit board through positional alignment as the thermosetting resin, and thereafter executes the positional alignment of the bumps of the electronic component with the electrodes of the circuit board, and
  the bonding device hardens with the heat the thermosetting resin sheet interposed between the electronic component and the circuit board while performing the correction of the warp of the circuit board by pressurizing the electronic component against the circuit board with the heat applied to the thermosetting resin sheet so as to achieve the bonding.

According to a twentieth aspect of the present invention, there is provided an electronic component mounting apparatus according to the thirteenth aspect, wherein the positional alignment device sticks a solid thermosetting resin sheet where particles each of which has a size that is greater than a thickness of a passivation film to be coated on at least the electrodes of the electronic component and smaller than a thickness of one of the electrodes of the circuit board and are comprised of: resin balls whose surfaces are plated with gold; or nickel particles; or conductive particles made of silver, silver-palladium, or gold; or a conductive paste; or gold balls are embedded inside holes formed in positions corresponding to either the electrodes of the electronic component or the electrodes of the circuit board in a direction in which the particles are interposed between the electrodes of the electronic component and the circuit electrodes of the circuit board and in which the electrodes are made mutually electrically continuous, to the electrodes of the circuit board through positional alignment as the thermosetting resin when mounting the electronic component on the circuit board, and thereafter executes the positional alignment of the electrodes of the electronic component with the electrodes of the circuit board, and
  the bonding device hardens with the heat the thermosetting resin sheet interposed between the electronic component and the circuit board while pressurizing the electronic component against the circuit board with the heat applied to the thermosetting resin sheet and with ultrasonic vibrations applied to the electronic component so as to achieve the bonding.

According to a twenty-first aspect of the present invention, there is provided an electronic component mounting apparatus according to the fifteenth aspect, wherein the conductive particles included in the anisotropic conductive film are nickel particles plated with gold.

According to a twenty-second aspect of the present invention, there is provided an electronic component mounting apparatus according to any one of the thirteenth through twenty-first aspects, wherein the thermosetting resin is provided by a thermosetting resin sheet.

According to a twenty-third aspect of the present invention, there is provided an electronic component mounting apparatus according to the twenty-second aspect, wherein the thermosetting resin sheet has a thickness greater than a gap between an active surface of the electronic component and a surface which belongs to the circuit board and on which the electrodes are formed after the bonding.

According to a twenty-fourth aspect of the present invention, there is provided an electronic component mounting apparatus according to the thirteenth or fourteenth aspect, wherein the thermosetting resin is provided by a thermosetting adhesive.

According to a twenty-fifth aspect of the present invention, there is provided an electronic component mounting apparatus cording to any one of the thirteenth through twenty-fourth aspects, wherein the positional alignment device and the bonding device are constructed of one device.

According to a twenty-sixth aspect of the present invention, there is provided an electronic component mounting method according to any one of the first through twelfth aspects, wherein a conductive paste is applied, to the bumps after the positional alignment and before the bonding, and thereafter the conductive paste is hardened to function as part of the bump, making the hardened conductive paste break through the thermosetting resin during the bonding for the electrical connection between the conductive paste and the electrode of the circuit board.

According to a twenty-seventh aspect of the present invention, there is provided an electronic component mounting apparatus according to any one of the thirteenth through twenty-fifth aspects, wherein a conductive paste is applied to the bumps after the positional alignment and before the bonding, and thereafter the conductive paste is hardened to function as part of the bump, making the hardened conductive paste break through the thermosetting resin during the bonding for the electrical connection between the conductive paste and the electrode of the circuit board.

According to a twenty-eighth aspect of the present invention, there is provided an electronic component mounting method according to any one of the first through ninth aspects or the eleventh aspect, wherein the thermosetting resin sheet is arranged on a side of the circuit board.

According to a twenty-ninth aspect of the present invention, there is provided an electronic component mounting method according to any one of the first through ninth aspects or the eleventh aspect, wherein the thermosetting resin sheet is arranged on a side of the electronic component.

According to a thirtieth aspect of the present invention, there is provided an electronic component mounting apparatus according to any one of the thirteenth through twenty-first aspects or the twenty-third aspect, wherein the thermosetting resin sheet is arranged on a side of the circuit board.

According to a thirty-first aspect of the present invention, there is provided an electronic component mounting apparatus according to any one of the thirteenth through twenty-first aspects or the twenty-third aspect, wherein the thermosetting resin sheet is arranged on a side of the electronic component. According to the aforementioned aspects, for instance, a ball is formed of an Au wire through electric discharge by a wire bonder on Al of an IC chip or an electrode pad formed by incorporating Si, Cu, or the like into Al when mounting an electronic component such as an IC chip on a circuit board, and the ball is bonded to the electrode pad of the IC chip while applying ultrasonic waves to the ball by a capillary.

BRIEF DESCRIPTION OF DRAWINGS

These and other aspects and features of the present invention will become clear from the following description taken in conjunction with the preferred embodiments thereof with reference to the accompanying drawings, in which:

FIGS. 5A, 5B, 5C, 5D, 5E, and 5F are explanatory views showing a process for bonding an IC chip to a circuit board when an anisotropic conductive film is employed in place of a thermosetting resin sheet according to the mounting method of the first embodiment of the present invention;

FIG. 6 is an explanatory view showing a process for bonding an IC chip to a circuit board according to the embodiment of FIG. 5 of the first embodiment of the present invention;

FIGS. 11A, 11B, 11C, 11D, 11E, 11F, and 11G are explanatory views showing a process for bonding an IC chip to a circuit board by a mounting method according to a fifth embodiment of the present invention;

FIGS. 12A, 12B, 12C, 12D, 12E, 12F, 12G, and 12H are explanatory views showing a process for bonding an IC chip to a circuit board by a mounting method according to a sixth embodiment of the present invention;

BEST MODE FOR CARRYING OUT THE INVENTION

Figure 1A:
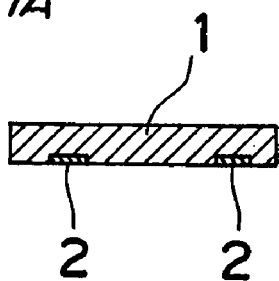
FIGS. 1A, 1B, 1C, 1D, 1E, 1F, 1G, 1H, 1I, and 1J are explanatory views showing a method for mounting an electronic component such as an IC chip on a circuit board according to a first embodiment of the present invention.

Before the description of the present invention proceeds, it is to be noted that like parts are designated by like reference numerals throughout the accompanying drawings.

An IC chip mounting method and a manufacturing apparatus thereof according to a first embodiment of the present invention will be described with reference to FIG. 1A through FIG. 12H.

The method for mounting an IC chip on a circuit board according to the first embodiment of the present invention will be described with reference to FIG. 1A through FIG. 3C. On an IC chip 1 shown in FIG. 1A, bumps (protruding electrodes) 3 are formed on Al pad electrodes 2 of the IC chip 1 through the operations as shown in FIGS. 2A through 2F by a wire bonder. That is, a ball 96 is formed at the lower end of a wire 95 that is protruding from a holder 93 in FIG. 2A, and the holder 93 that is holding the wire 95 is moved down to bond the ball 96 to the electrode 2 of the IC chip 1, forming the approximate shape of the bump 3 as shown in FIG. 2B. In FIG. 2C, the holder 93 is started to move up with the wire 95 fed downward. The holder 93 is moved in an approximately rectangular loop 99 as shown in FIG. 2D to form a curved portion 98 on the bump 3 as shown in FIG. 2E, and the wire is torn off to form the bump 3 as shown in FIG. 2F. It is otherwise acceptable to clamp the wire 95 by the holder 93 in FIG. 2B and move up the holder 93 to pull up the wire, tearing off the gold wire 95 for the formation of the shape of the bump 3 as shown in FIG. 2G. The state in which the bumps 3 are formed on the electrodes 2 of the IC chip 1 as described above is shown in FIG. 1B.

Figure 1C:
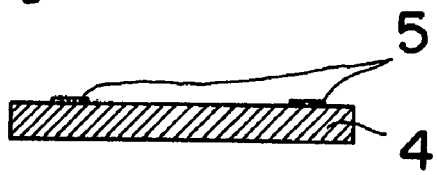
Figure 1B:
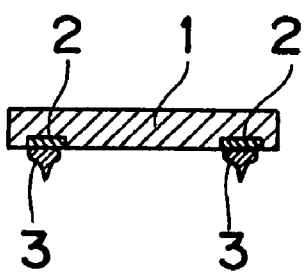
Figure 1D:
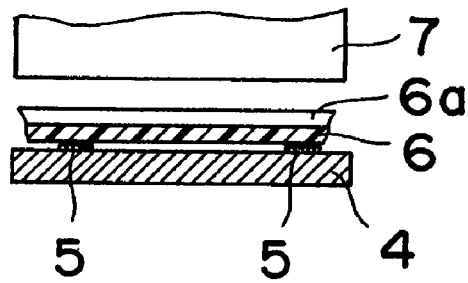
Figure 2A:
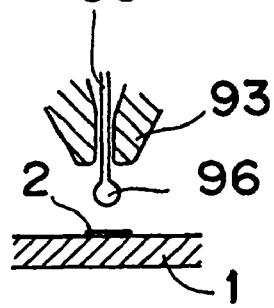
FIGS. 2A, 2B, 2C, 2D, 2E, 2F, and 2G are explanatory views showing a bump forming process by means of an IC chip wire bonder according to the mounting method of the first embodiment of the present invention.
Figure 2B:
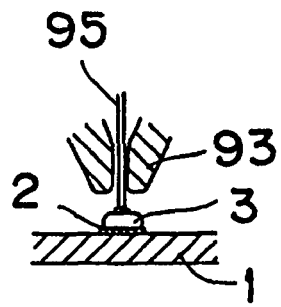
Figure 2C:
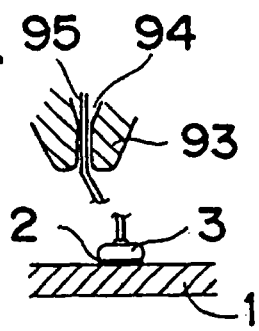
Figure 2D:
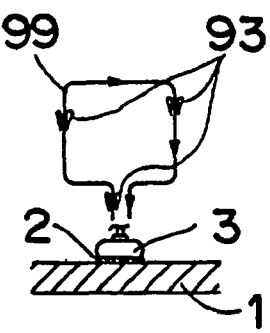
Figure 2E:
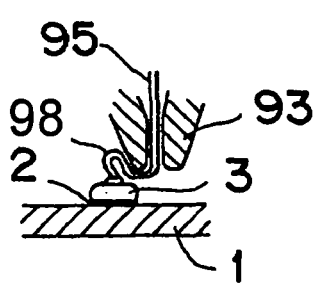
Figure 2G:
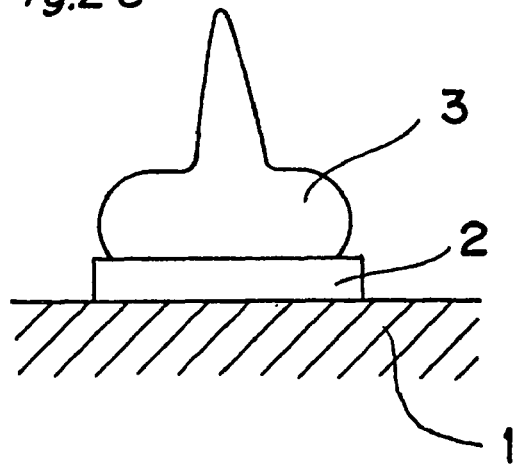
Figure 2F:
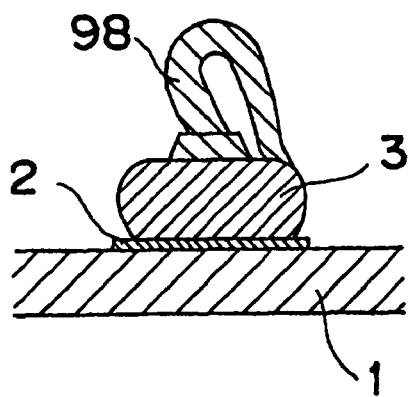

Next, a thermosetting resin sheet 6 cut in a size slightly greater than the size of the IC chip 1 is placed on the electrodes 5 of circuit board 4 shown in FIG. 1C in a manner as shown in FIG. 1D, and thermosetting resin sheet 6 is stuck to the electrodes 5 of the board 4 with a pressure of, for example, about 5 to 10 kgf/cm$^2$ by a sticking tool 7 heated to, for example, 80 to 120° C. Subsequently, a separator 6a that is removably arranged on the tool 7 side of the thermosetting resin sheet 6 is peeled off to complete the preparation process of the board 4. This separator 6a is to prevent the thermosetting resin sheet 6 from sticking to the tool 7. In this case, the thermosetting resin sheet 6 is preferably provided by a material including an inorganic filler such as silica (for example, epoxy resin, phenol resin, or polyimide) or a material including no inorganic filler (for example, epoxy resin, phenol resin, or polyimide) and has a degree of heat resistance capable of withstanding a high temperature in the subsequent reflow process (for example, a degree of heat resistance capable of withstanding a temperature of 240° C. for ten seconds).

Figure 1E:
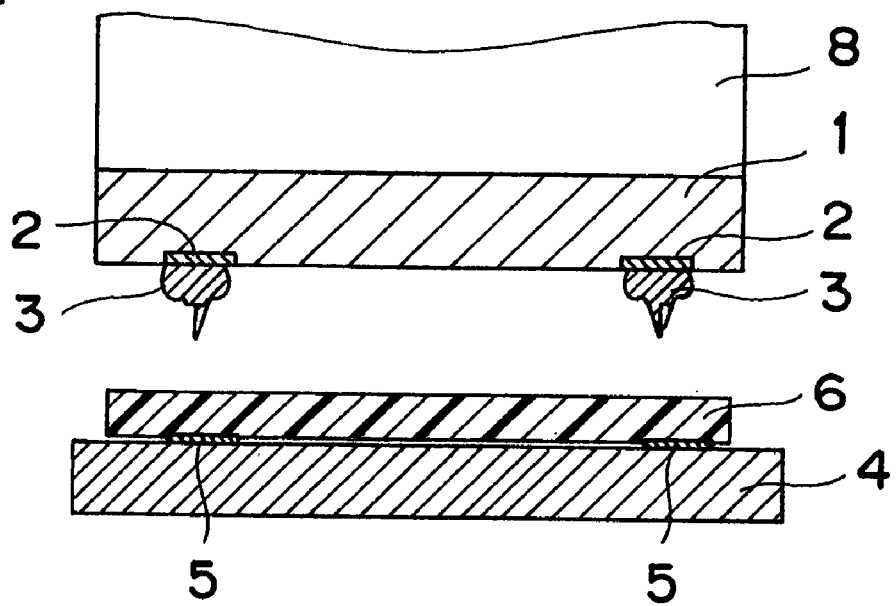
Figure 1F:
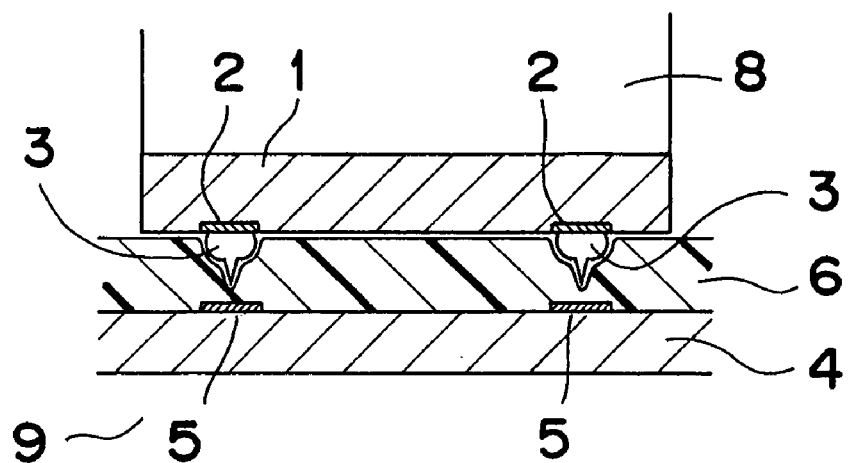
Figure 3A:
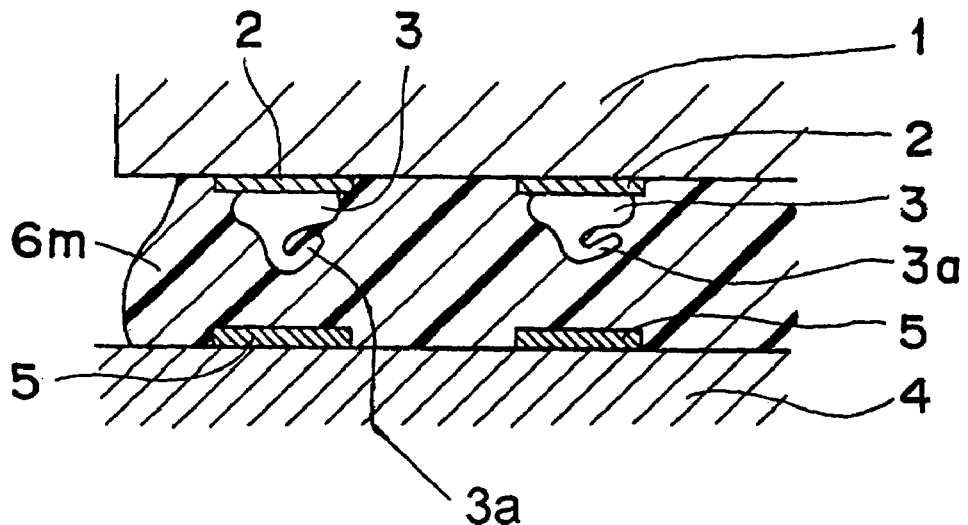
FIGS. 3A, 3B, and 3C are explanatory views showing a process for bonding an IC chip to a circuit board according to the mounting method of the first embodiment of the present invention.
Figure 3B:
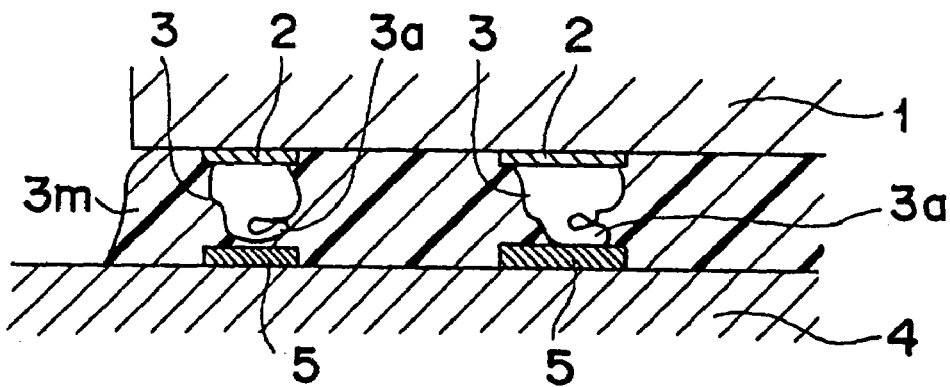
Figure 3C:
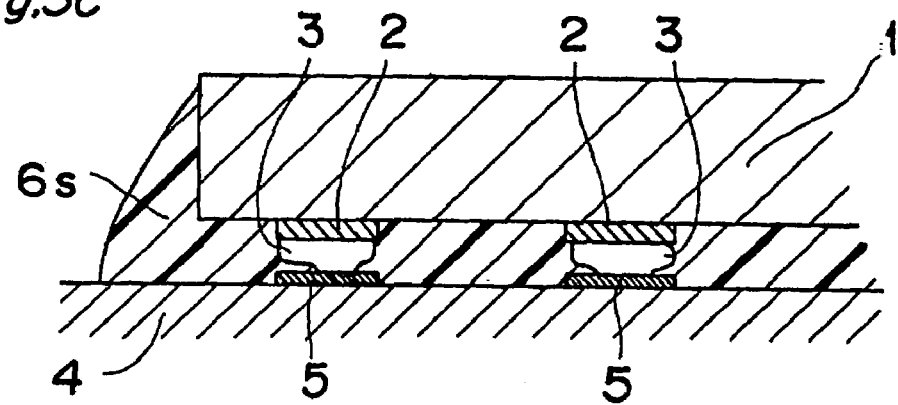

Next, as shown in FIGS. 1E and 1F, the IC chip 1 on which the bumps 3 have been formed on the electrodes 2 in the aforementioned preceding process is aligned in position with the electrodes 5 that belong to the board 4 prepared in the preceding process and correspond to the electrodes 2 of the IC chip 1, and thereafter is pressed by a heated bonding tool 8. In this stage, head portion 3a of the bump 3 is pressed against the electrode 5 of the board 4 while being deformed as shown from FIG. 3A to FIG. 3B. In this stage, a load to be applied to the bump 3 via the IC chip 1 differs depending on the diameter of the bump 3. It is required to apply a degree of load with which the head portion 3a of the bump 3, bent and folded, is necessarily deformed as shown in FIG. 3C. This load is required to be 20 (gf) at a minimum. The upper limit of the load is determined so that no damage occurs in the IC chip 1, the bump 3, the circuit board 4, and so on. Depending on cases, the maximum load may sometimes exceed 100 (gf). It is to be noted that the reference numerals 6m and 6s denote the thermosetting resin of the thermosetting resin sheet 6 being melted by the heat of the bonding tool 8 and the resin that has been thermally hardened after such melting.

Figure 1G:
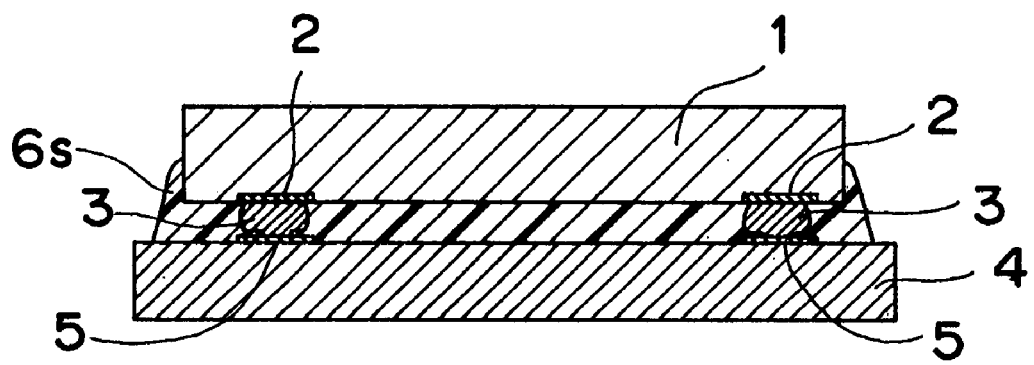
Figure 4A:
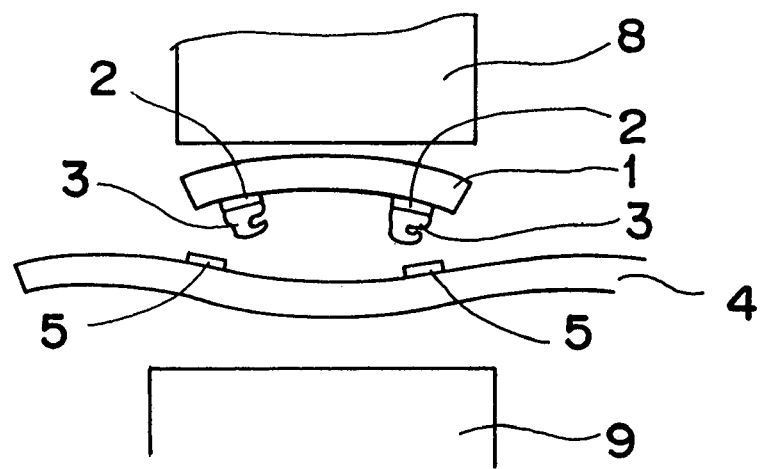
FIGS. 4A, 4B, and 4C are explanatory views showing a process for bonding an IC chip to a circuit board according to the mounting method of the first embodiment of the present invention.
Figure 4B:
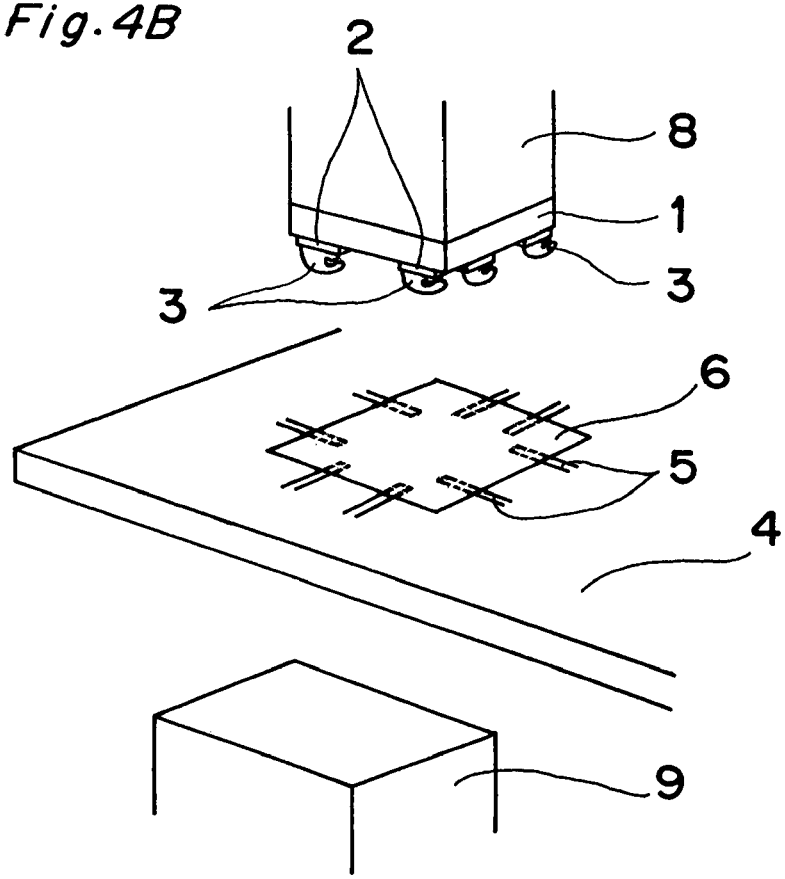
Figure 4C:
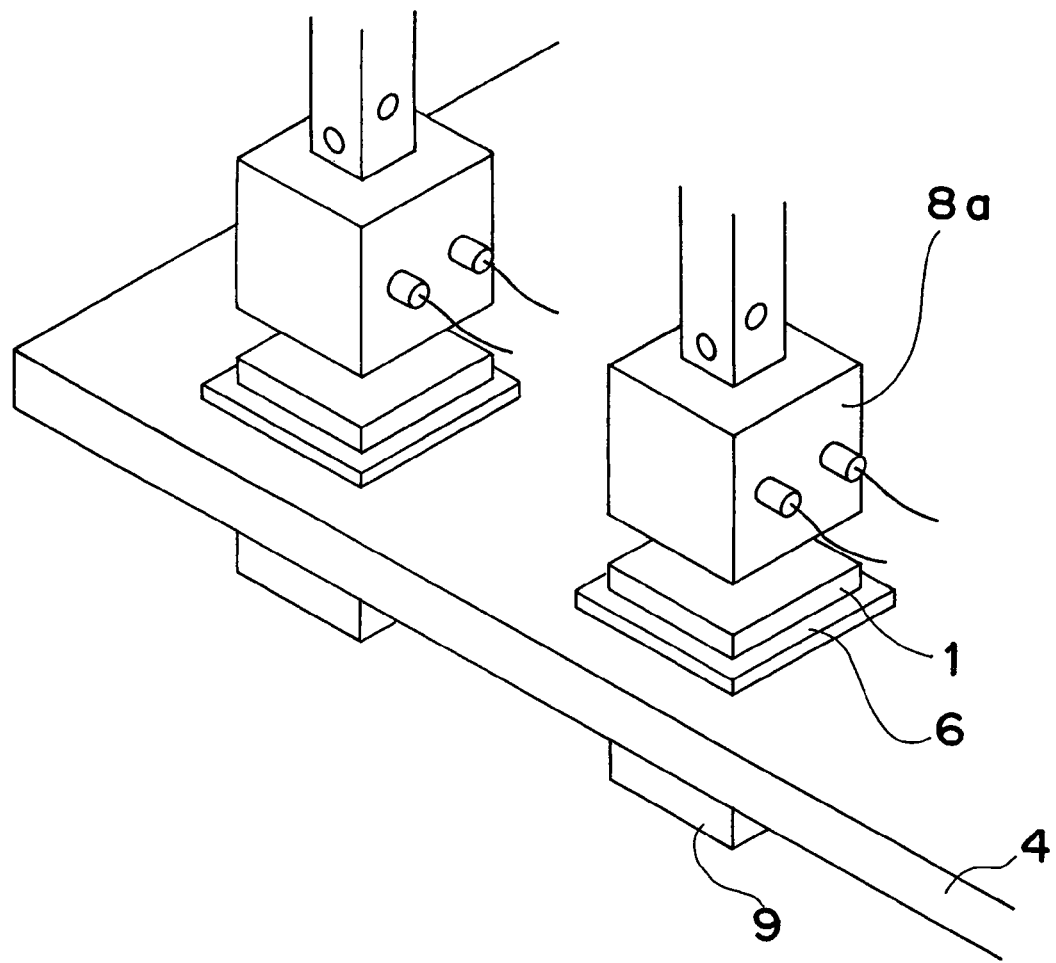

It is to be noted that a positional alignment process for aligning in position the IC chip 1, on which the bumps 3 have been formed on the electrodes 2 in the aforementioned preceding process by the bonding tool 8 heated by a built-in heater such as a ceramic heater or a pulse heater, with the electrodes 5 that belong to the board 4 and has been prepared in the aforementioned preceding process in correspondence with the electrodes 2 of the IC chip 1 as shown in FIG. 1E and FIG. 1F; and a process for pressure bonding them together after the positional alignment as shown in FIG. 1G may be executed by one position aligning-cum-pressure bonding device or, for example, a position aligning-cum-pressure bonding device of FIG. 1F. However, it is also acceptable to execute the positional alignment process by a positional alignment device of FIG. 4B and execute the pressure bonding process by a bonding device of FIG. 4C, i.e., by other devices in order to improve productivity by simultaneously executing the positional alignment work and the pressure bonding work when, for example, a number of boards are continuously produced. It is to be noted that FIG. 4C shows two bonding devices for enabling two portions of one circuit board 4 to be simultaneously pressure-bonded to improve the productivity.

In this case, the circuit board 4 is provided by a glass cloth base epoxy copper clad laminate board (glass epoxy board), a glass cloth base polyimide resin copper clad laminate board, or the like. These boards 4 have warp and undulation due to thermal hysteresis, cutting, and processing, meaning that their surfaces are not completely flat surfaces. Therefore, as shown in FIGS. 4A and 4B, by using the boding tool 8 and a stage 9 of which the parallelism is controlled so as to be adjusted to, for example, about 5 $\mu$m or less, heat and load are locally applied to the circuit board 4 through the IC chip 1 from the side of the bonding tool 8 toward the side of the stage 9, so that the warp of the portion of the circuit board 4 receiving the heat and load is corrected. The IC chip 1 is warped with a concave portion located around the center of its active surface. By pressurizing this with a heavy load of not smaller than 20 gf in the bonding stage, the warp and undulation of both the board 4 and the IC chip 1 can be corrected. The warp of the IC chip 1 is generated by an internal stress occurring when the IC chip 1 is formed, that is, when a thin film is formed on Si.

In the state in which the warp of the circuit board 4 is corrected, heat of, for example, 140 to 230° C. is applied to the thermosetting resin sheet 6 located between the IC chip 1 and the circuit board 4 for about several seconds to 20 seconds, so that this thermosetting resin sheet 6 is hardened. In this stage, because of the composition of the circuit board, and the temperature and duration of the heating of the circuit board, the circuit board is softened to some extent. This softening aids in the warp of the circuit board being corrected. Also, the thermosetting resin that constitutes the thermosetting resin sheet 6 flows at the beginning to encapsulate the IC chip 1 up to its edges. The thermosetting resin is naturally softened in the early stage when heated because it is resin, and therefore, the resin gains fluidity to flow up to the edges. By making the thermosetting resin have a volume greater than the volume of a space between the IC chip 1 and the circuit board, the resin flows so as to ooze out of this space, thereby enabling the encapsulating effect to be produced. Subsequently, the heated tool 8 is moved up and the heat source is removed, thus abruptly reducing the temperatures of the IC chip 1 and the thermosetting resin sheet 6. Consequently, the thermosetting resin 6 losses its fluidity, and as shown in FIG. 1G and FIG. 3C, the IC chip 1 is fixed on the circuit board 4 by the hardened thermosetting resin 6s. If the circuit board 4 is heated by the stage 9, then the temperature of the bonding tool 8 can be set lower.

Figure 1H:
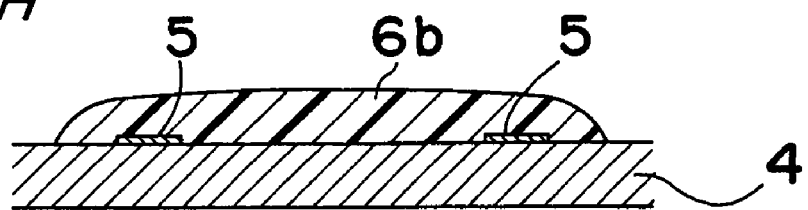

Instead of sticking the thermosetting resin sheet 6, it is acceptable to place a thermosetting adhesive 6b on the circuit board 4 by coating through dispensing or the like or printing or transfer as shown in FIG. 1H. When using the thermosetting adhesive 6b, basically the same processes as the aforementioned processes using the thermosetting resin sheet 6 are executed. When using the thermosetting resin sheet 6, there are the advantage that the sheet 6 is easy to handle because the thermosetting resin sheet 6 is solid, the advantage that the sheet 6 can be formed of polymer because no liquid component exists and the advantage that a sheet having a high glass transition point is easy to be formed. In contrast to this, when using the thermosetting adhesive 6b, the adhesive 6b can be coated, printed, or transferred in an arbitrary position and an arbitrary size on the board 4.

It is also acceptable to use an anisotropic conductive film (ACF) in place of the thermosetting resin, and by further using nickel powders plated with gold as conductive particles to be included in the anisotropic conductive film, the connection resistance value between the electrode 5 and the bump 3 can be reduced, to a further advantage.

The mounting process in the case where the anisotropic conductive film 10 is used in place of the thermosetting resin sheet 6 as described above will be described with reference to FIGS. 2A through 5F. On the IC chip 1 of FIG. 5A, bumps (protruding electrodes) 3 are formed on the Al pad electrodes 2 of the IC chip 1 by a wire bonder as shown in FIG. 5B through the operations shown in FIGS. 2A through 2F. Otherwise, it is acceptable to tear off the gold wire 95 by clamping the wire 95 by the holder 93 and pulling the wire upward in FIG. 2B, forming a bump shape as shown in FIG. 2G.

Next, an anisotropic conductive film sheet 10 cut in a size slightly larger than the size of the IC chip 1 is placed on the electrodes 5 of the circuit board 4 of FIG. 5C as shown in FIG. 5D, and then stuck to the board 4 with a pressure of, for example, about 5 to 10 kgf/cm$^2$ by the sticking tool 7 heated to, for example, 80 to 120° C. Subsequently, by peeling off the separator on the tool side of the anisotropic conductive film sheet 10, the preparation process of the circuit board 4 is completed.

Next, as shown in FIG. 5E, the IC chip 1 on which the bumps 3 have been formed through the aforementioned processes are aligned in position with the electrodes 5 that belong to the board 4 prepared through the aforementioned processes and correspond to the IC chip 1, and are pressed via the anisotropic conductive film sheet 10, by the heated bonding tool 8. In this stage, the bump 3 is pressed against the electrode 5 of the board 4 with the head portion 3a of the bump 3 being deformed from the state of FIG. 3B to the state of FIG. 3C. In this stage, the load to be applied depends on the diameter of the bump 3, and the portion that belongs to the head portion 3a and is bent and folded is necessarily deformed as shown in FIG. 3C. In this case, when conductive particles 10a inside the anisotropic conductive film sheet 10 are obtained by plating resin balls with a metal as shown in FIG. 6, the conductive particles 10a are required to be deformed. When the conductive particles 10a inside the anisotropic conductive film sheet 10 are metal particles of nickel or the like, it is required to apply a load such that the particles get into the bump 3 and the electrode 5 located on the board side. This load is required to be 20 (gf) at a minimum. The load may exceed 100 (gf) at a maximum.

In this case, the circuit board 4 is provided by a multilayer ceramic board, a glass cloth base epoxy copper clad laminate board (glass epoxy board), an aramid unwoven fabric board, a glass cloth base polyimide resin copper clad laminate board, FPC (Flexible printed circuit board), or the like. These boards 4 have warp and undulation due to thermal hysteresis, cutting, and processing, meaning that their surfaces are not the completely flat surfaces. Therefore, by locally applying heat and load to the circuit board 4 through the IC chip 1, the warp of the portion that belongs to the circuit board 4 and has received the heat and load is corrected.

Thus, in the state in which the warp of the circuit board 4 is corrected, heat of, for example, 140 to 230° C. is applied to the anisotropic conductive film 10 between the IC chip 1 and the circuit board 4 for, for example, about several seconds to 20 seconds, so that this anisotropic conductive film 10 is hardened. In this stage, the material of film 10 flows at the beginning to encapsulate the IC chip 1 up to its edges. The material of film 10 is naturally softened in the early stage when heated and therefore gains fluidity to flow up to the edges. By making the material of film 10 have a volume greater than the volume of a space between the IC chip 1 and the circuit board, the material flows so as to ooze out of this space, thereby enabling the encapsulating effect to be produced. Subsequently, the heated tool 8 is moved up and the heat source is removed, thus abruptly reducing the temperatures of the IC chip 1 and the anisotropic conductive film 10. Consequently, the anisotropic conductive film 10 looses its fluidity, and as shown in FIG. 5F, the IC chip 1 is fixed on the circuit board 4 by the material 10s that has constituted the anisotropic conductive film 10. If the circuit board 4 is heated, then the temperature of the bonding tool 8 can be set lower.

With this arrangement, the anisotropic conductive film 10 can be employed in place of the thermosetting resin sheet 6, and by further using nickel powders plated with gold as conductive particles 10a to be included in the anisotropic conductive film 10, the connection resistance value can be reduced, to a further advantage.

Figure 1I:
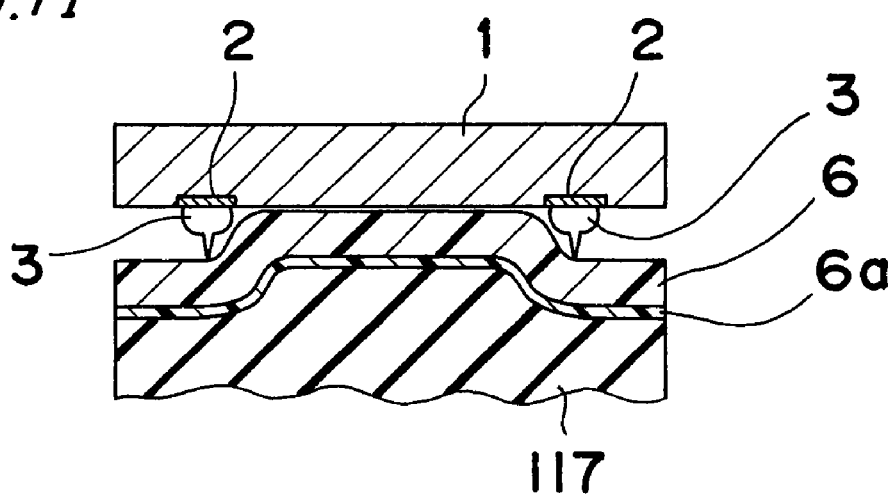
Figure 1J:
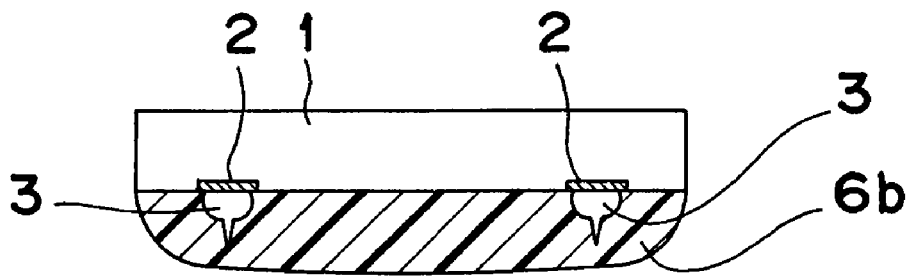

FIG. 1A through FIG. 1H have described the formation of the thermosetting resin sheet 6 or the thermosetting adhesive 6b on the side of the circuit board 4. However, the present invention is not limited to this, and it is acceptable to form the thermosetting resin sheet 6 or the thermosetting adhesive 6b on the side of the IC chip 1 as shown in FIG. 1I or 1J. In this case, and particularly in the case of the thermosetting resin sheet 6, it is acceptable to press the IC chip 1 against an elastic body 117 such as rubber together with separator 6a removably arranged on the circuit board side of the thermosetting resin sheet 6 so that the thermosetting resin sheet 6 is stuck to the IC chip 1 along the shape of the bump 3.

Figure 7A:
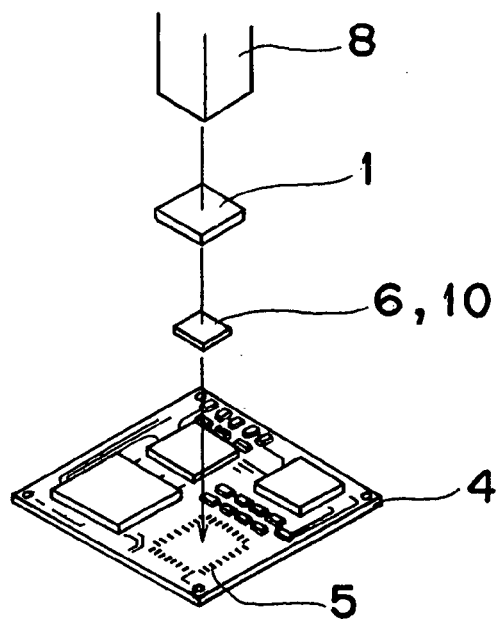
FIGS. 7A, 7B, and 7C are explanatory views showing a process for bonding an IC chip to a circuit board by a mounting method according to a second embodiment of the present invention.
Figure 7B:
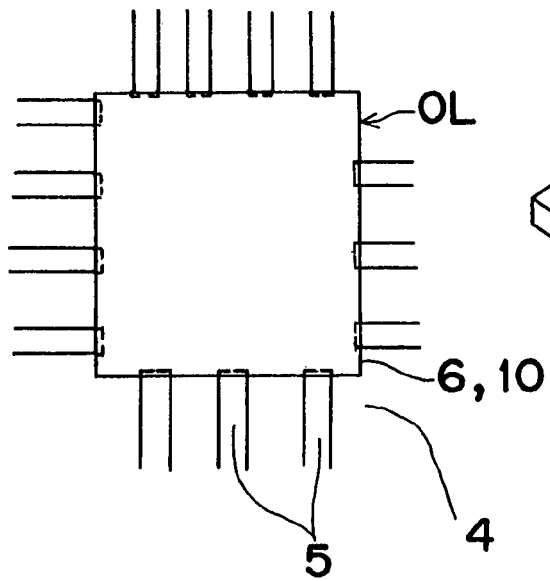
Figure 7C:
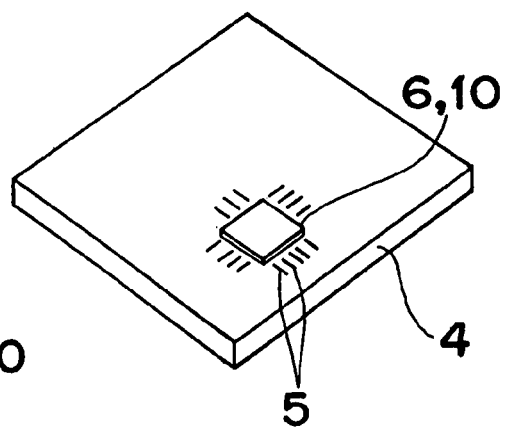
Figure 8A:
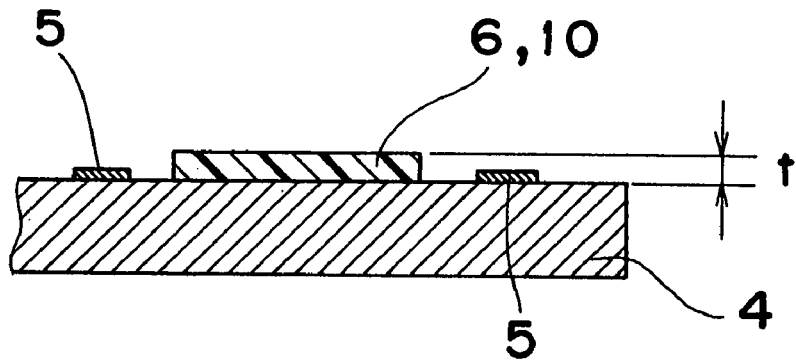
FIGS. 8A, 8B, and 8C are explanatory views showing a process for bonding an IC chip to a circuit board by the mounting method of the second embodiment of the present invention.
Figure 8B:
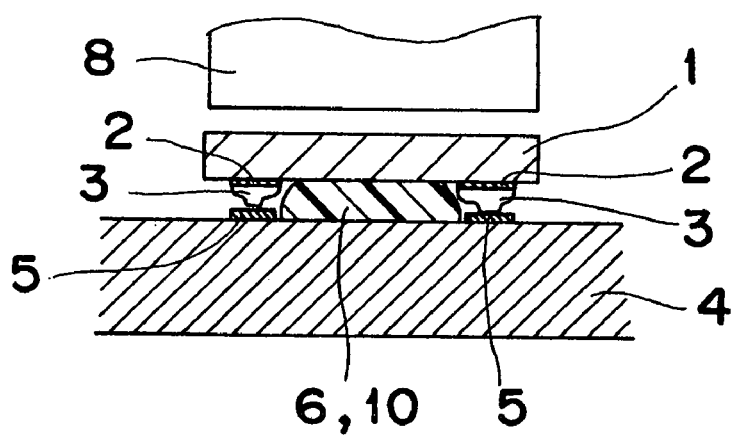
Figure 8C:
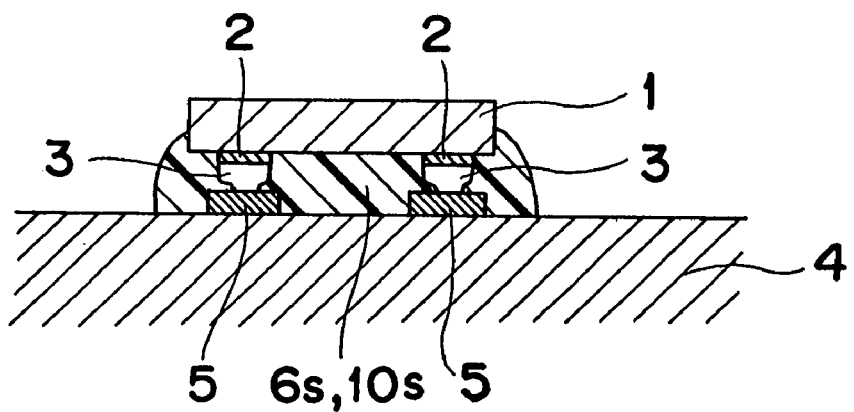

A mounting method and apparatus according to a second embodiment of the present invention will be described with reference to FIGS. 7A through 7C and 8A through 8C. As described hereinabove, the protruding electrodes (bumps) 3 are formed on the electrodes 2 of the IC chip 1, while a sheet-shaped thermosetting resin or the thermosetting adhesive 6 having a shape dimension smaller than the outside dimension OL of the connection between the inner end edges of the electrodes 2 of the IC chip 1 is stuck to or coated on a center portion of the connection between the electrodes 5 of the circuit board 4, as shown in FIGS. 7B, 7C, and 8A. Next, the bumps 3 and the electrodes 5 of the circuit board 4 are aligned in position. As shown in FIG. 7A and FIG. 8B, the IC chip 1 is pressed against the circuit board 4 by the heated head 8 to harden the thermosetting resin or the thermosetting adhesive 6 interposed between the IC chip 1 and the circuit board 4 while simultaneously performing the warp correction of the board 4. In this stage, the thermosetting resin or the thermosetting adhesive 6 is softened as described hereinbefore by the heat applied from the head 8 via the IC chip 1 and flows outwardly from the position to which the resin has been stuck as shown in FIG. 8C. This outflow thermosetting resin or thermosetting adhesive 6 becomes the encapsulation material (underfill) to remarkably improve the reliability of bonding of the bumps 3 to the electrodes 5. After a lapse of a certain time, the hardening of the thermosetting resin or the thermosetting adhesive 6 gradually progresses, eventually bonding the IC chip 1 and the circuit board 4 together with the hardened resin 6s. By moving up the bonding tool 8 that is pressing the IC chip 1, the bonding of the IC chip 1 to the electrodes 5 of the circuit board 4 is completed. Strictly speaking, the reaction of the thermosetting resin progresses while heating in the case of the thermal hardening, and the fluidity almost disappears as the bonding tool 8 is moving up. According to the aforementioned method, the thermosetting resin or the thermosetting adhesive 6 is not covering the electrode 5 before the bonding. Therefore, the bumps 3 are brought in direct contact with the electrodes 5 during bonding, and the thermosetting resin or the thermosetting adhesive 6 does not flow beneath the electrode 5, so that the value of the connection resistance between the bump 3 and the electrode 5 can be reduced. If the circuit board is heated, then the temperature of the bonding head 8 can be further lowered.

A mounting method and apparatus according to a third embodiment of the present invention will be described next with reference to FIGS. 9A through 9C. This third embodiment is a mounting method and apparatus for executing bonding after leveling.

Figure 9A:
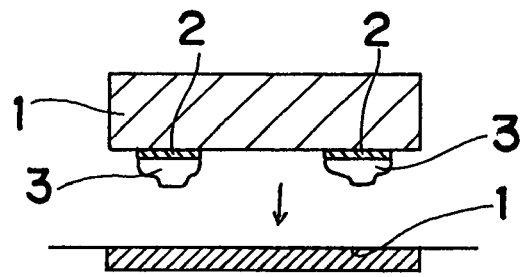
FIGS. 9A, 9B, 9C, 9D, and 9E are explanatory views showing a process for bonding an IC chip to a circuit board by a mounting method according to a third embodiment of the present invention.

First, as shown in FIG. 9A, the protruding electrodes (bumps) 3 are formed on the electrodes 2 on the IC chip 1 by means of the wire bonder according to the method described hereinabove, and the bumps 3 are dipped in a conductive adhesive 11 accommodated in a pan-shaped vessel, transferring the conductive adhesive 11 onto the bumps 3. On the other hand, a thermosetting resin sheet or the thermosetting adhesive 6 having a shape dimension $L_2$ smaller than the outside dimension LB of the connection between the electrodes 2 of the IC chip 1 is stuck to or coated on the center portion of the connection between the electrodes 5 of the circuit board 4. Next, the bumps 3 are aligned in position with the electrodes 5 of the circuit board 4 as shown in FIG. 9C, and the thermosetting resin or the thermosetting adhesive 6 interposed between the IC chip 1 and the circuit board 4 is hardened with the warp correction of the board 4 simultaneously performed by pressurizing the IC chip 1 against the circuit board 4, by the heated bonding head 8, so that the IC chip 1 and the board 4 are bonded together by the hardened resin 6s. In this stage, the thermosetting resin or the thermosetting adhesive 6 is softened by the heat applied from the bonding head 8 via the IC chip 1 as described hereinabove and flows outwardly while being pressurized from the position where the thermosetting resin or the thermosetting adhesive 6 is stuck as shown in FIG. 9B. This outflow thermosetting resin or the thermosetting adhesive 6 becomes an encapsulation material (underfill), thereby remarkably improving the reliability of the bonding of the bumps 3 to the electrodes 5. Furthermore, the conductive adhesive 11 adhering to the bumps 3 is also hardened to allow the elimination of the heating process for hardening only the conductive adhesive 11. Subsequently, the tool 8 that is pressurizing the IC chip 1 is moved up. Through the aforementioned processes, the bonding of the IC chip 1 to the electrodes 5 of the board 4 is completed. If the circuit board side is heated, then the temperature of the bonding head 8 can be further lowered. It is also preferable to provide the setting of $L_2<LB$. It is also acceptable to perform the heating within a short time and thereafter perform main heating by means of a furnace or the like. In this case, an equivalent operation can be achieved by using a resin that contracts when hardened. It is also acceptable to perform the underfill partially by this method as shown in FIG. 9D instead of performing the underfill wholly with the above resin and thereafter inject an underfill 400 as shown in FIG. 9E.

Figure 9B:
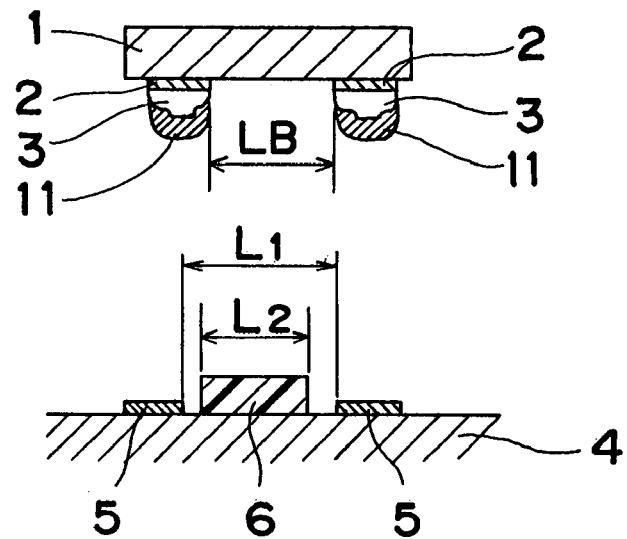
Figure 9C:
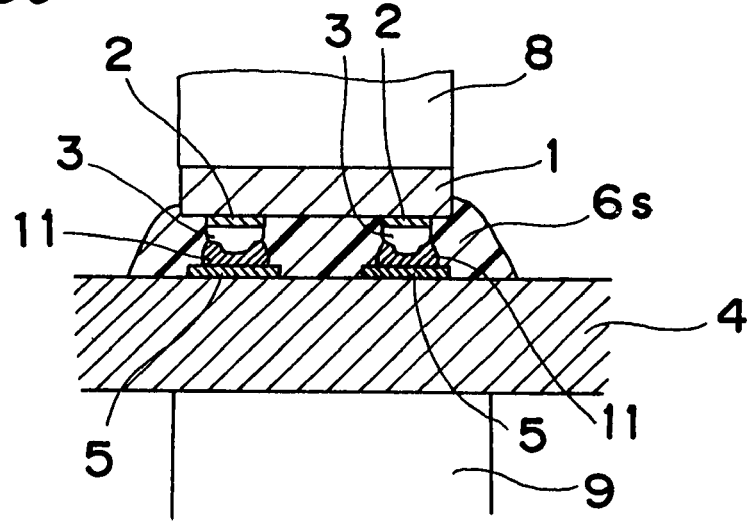
Figure 9D:
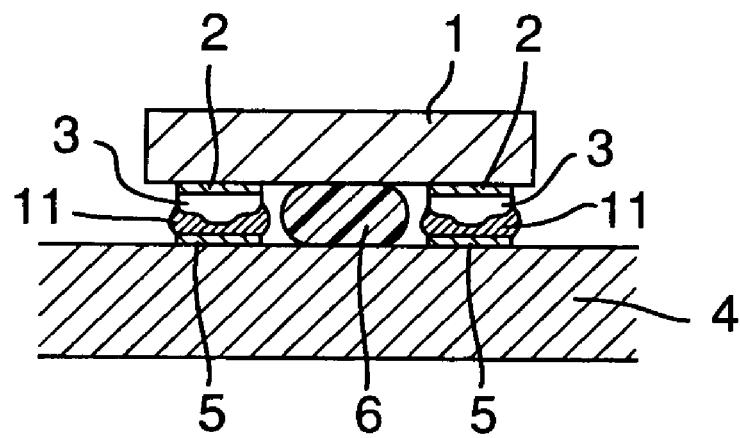
Figure 9E:
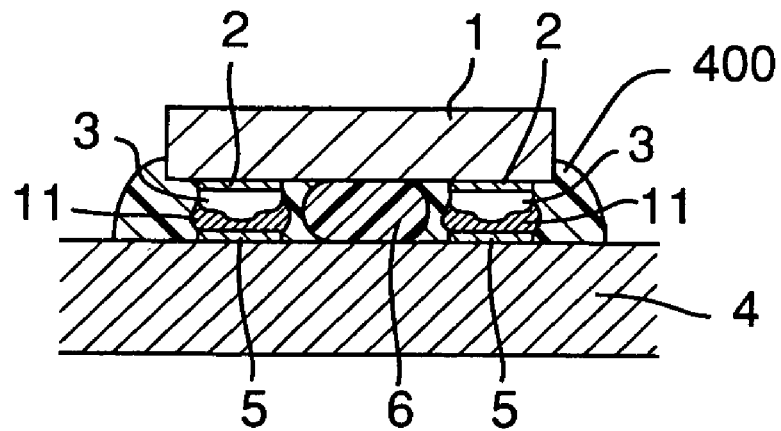

In FIG. 9A, if the tool 8 for holding the IC chip 1 is provided with a built-in heater 8 such as a ceramic heater or pulse heater and the conductive adhesive 11 is heated (from, for example, 60 to 200° C.) and hardened before performing the process of FIG. 9B so as to make the conductive adhesive 11 function as part of the bump 3, then the conductive adhesive 11 is allowed to penetrate the thermosetting resin sheet or the thermosetting adhesive 6. Consequently, in this case, the thermosetting resin sheet or the thermosetting adhesive 6 having the shape dimension $L_2$ smaller than the outside dimension LB of the connection between the electrodes 2 of the IC chip 1 can be used. In other words, the size of the thermosetting resin sheet or the thermosetting adhesive 6 is not required to be taken into consideration at all. Similar to the aforementioned embodiment, the anisotropic conductive film 10 may be used in place of the thermosetting resin sheet or the thermosetting adhesive 6. Further, by providing the conductive particles 10a included in the anisotropic conductive film by nickel powder plated with gold, the value of the connection resistance between the bump 3 and the electrode 5 can be reduced, to a further advantage.

Figure 10A:
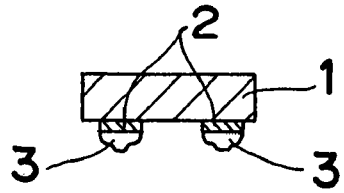
FIGS. 10A, 10B, 10C, 10D, 10E, and 10F are explanatory views showing a process for bonding an IC chip to a circuit board by a mounting method according to a fourth embodiment of the present invention.
Figure 10B:
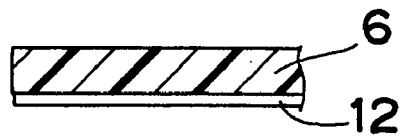
Figure 10C:
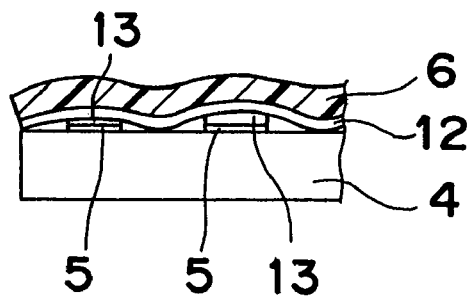
Figure 10D:
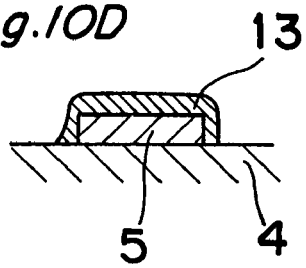
Figure 10E:
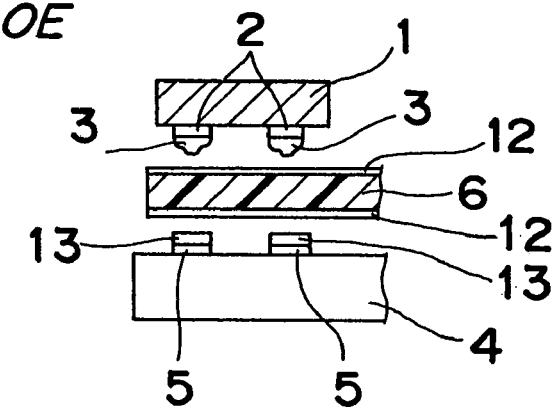
Figure 10F:
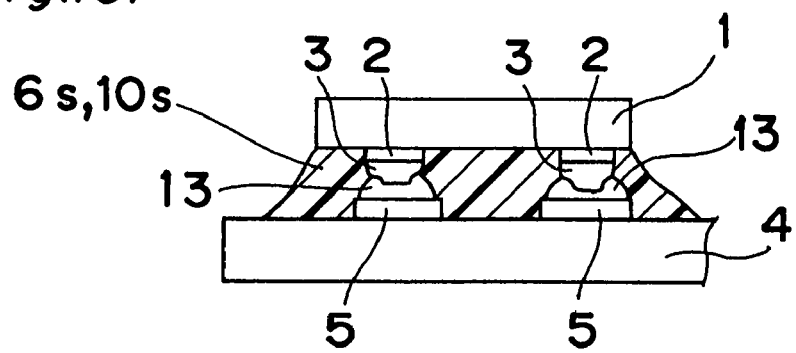
Figure 13:
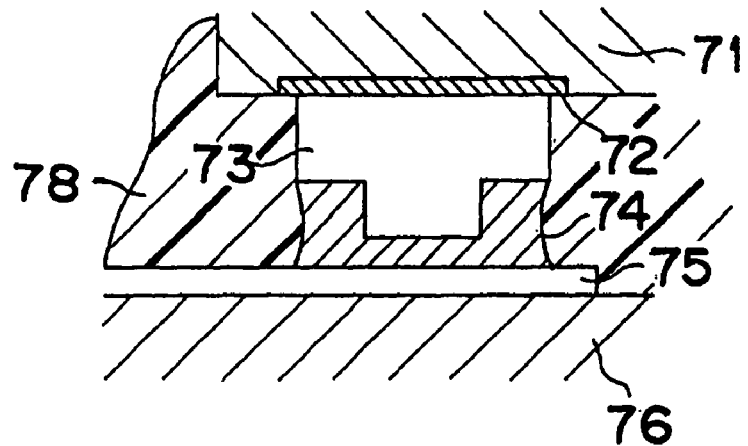
FIG. 13 is a sectional view showing a prior art method for bonding an IC chip to a circuit board.
Figure 14A:
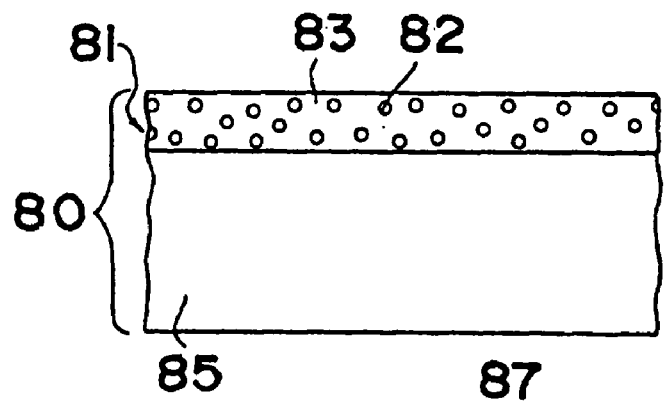
FIGS. 14A and 14B are explanatory views showing a prior art method for bonding an IC chip to a circuit board.
Figure 14B:
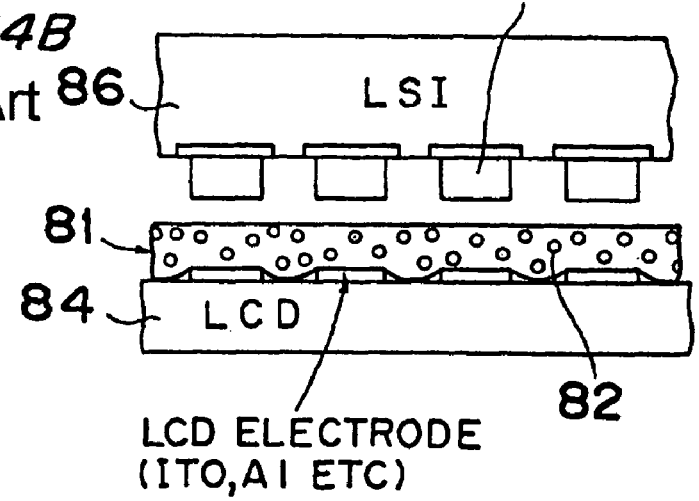

A mounting method and apparatus according to a fourth embodiment of the present invention will be described with reference to FIGS. 10A through 10F. As shown in FIG. 10A, protruding electrodes (bumps) 3 are formed on the electrodes (pads) 2 on the IC chip 1 when mounting the IC chip 1 on the circuit board 4. On the other hand, as shown in FIG. 10B, a flux layer 12 is formed by coating and drying a flux component on one surface or both surfaces of the thermosetting resin sheet 6. Otherwise, the flux layer 12 is formed by sticking a flux component sheet formed by drying the flux component to the thermosetting resin sheet 6. The thermosetting resin sheet 6 having the flux layer 12 is stuck to the circuit board 4 as shown in FIG. 10C. In this case, the thermosetting resin sheet 6 is stuck so that the flux layer 12 comes in contact with the circuit board 4. Next, the bumps 3 are aligned in position with the electrodes 5 of the circuit board 4, and the IC chip 1 is pressed against the circuit board 4 by the heated head 8. In this stage, if the flux layer 12 is coated on the IC chip side of the thermosetting resin sheet 6 as shown in FIG. 10E, then the bumps 3 come in contact with the flux layer 12 of the thermosetting resin sheet 6 and adhere to the same. The flux layer 12 formed on the board side of the thermosetting resin sheet 6 adheres to a bonding metal layer 13 formed on the electrodes 5 located on the board side when the thermosetting resin sheet 6 is stuck to the board 4 as shown in FIG. 10D. If the IC chip 1 is pressed against the circuit board 4 by the head 8, then the heat from the head 8 is conducted to the thermosetting resin sheet 6 via the IC chip 1 and activates the flux component of the flux layer 12 while simultaneously performing warp correction of the board 4. Further, the thermosetting resin sheet 6 interposed between the IC chip 1 and the circuit board 4 is hardened. The flux of the flux layer 12 adheres to the bumps 3 when the bumps 3 penetrate the resin sheet 6 and comes in contact with the bonding metal layer 13 that has been melted by heat and formed on the electrodes 5 of the circuit board 4, by which the bumps 3 and the electrodes 5 come in contact with each other via the flux and the bonding metal layer 13 to bond the IC chip 1 to the electrode 5 as shown in FIG. 10F.

If a metal that melts at a relatively low temperature of not greater than 300° C. is used as the bump 3, then the bonding metal layer 13 is, of course, not required to be provided on the circuit board 4. If the circuit board side is heated, then the temperature of the bonding head 8 can be further lowered.

It is a matter of course that the thermosetting adhesive or the anisotropic conductive film sheet 10 may be employed in place of the thermosetting resin sheet 6 in the present embodiment, similarly to the aforementioned embodiments.

A mounting method and apparatus according to a fifth embodiment of the present invention will be described with reference to FIGS. 11A through 11G. This fifth embodiment is a mounting method and apparatus that does not execute leveling at all, regardless of whether simultaneous or not.

As shown in FIGS. 11E and 11F, protruding electrodes (bumps) 3 are preparatorily formed on the electrodes 2 of the IC chip 1 by means of a wire bonder (not shown) when mounting the IC chip 1 on the circuit board 4. As shown in FIGS. 11A and 11B, through holes 15 that penetrate in a direction (direction of thickness of the resin sheet 6) in which the bumps 3 and the electrodes 5 of the circuit board 4 are brought in contact with each other and made conductive in the positions corresponding to the bumps 3 and the electrodes 5 of the circuit board 4 are formed through the thermosetting resin sheet. Then, as shown in FIGS. 11C and 11D, conductive particles 14 constructed of, for example, resin balls whose surfaces are plated with gold; or nickel particles; or conductive particles made of silver, silver-palladium, or gold; or a conductive paste; or particles comprised of gold balls formed in paste form are embedded in the through holes 15 by printing, pressing-in by a squeegee, or the like, forming a thermosetting resin sheet 66 having electrical conductivity. The thus-formed resin sheet 66 is stuck to the electrodes 5 of the circuit board 4 through positional alignment as shown in FIGS. 11E and 11F. When conductive particles 14 in paste form are used, by increasing the viscosity of the paste greater than the viscosity when the thermosetting adhesive of the thermosetting resin sheet 66 is bonded, the paste becomes hard to be pushed and by the resin of the thermosetting resin sheet 66 when the IC chip 1 is pressed, to a further advantage. Next, as shown in FIGS. 11E and 11F, the bumps 3 of the IC chip 1 are aligned in position with the electrodes 5 of the circuit board 4, and the IC chip 1 is pressed against the circuit board 4 by the heated bonding head 8 to harden the thermosetting resin in the thermosetting resin sheet 66 interposed between the IC chip 1 and the circuit board 4 while simultaneously performing leveling of the bumps 3 and warp correction of the board 4, so that as shown in FIG. 11G, the IC chip 1 is bonded to the circuit board 4 by the hardened resin 66s. If the circuit board side is heated, the temperature of the bonding head 8 can be further lowered.

A mounting method and apparatus according to a sixth embodiment of the present invention will be described next with reference to FIGS. 12A through 12H. This sixth embodiment is a mounting method and apparatus that does not execute leveling at all, regardless of whether simultaneous or not.

In FIG. 12A, holes 15 are formed through the thermosetting resin sheet 66 in positions corresponding to the electrodes 5 of the circuit board 4 in the direction of conduction to the electrode 5 of the circuit board 4 with interposition of the thermosetting resin sheet 66, and as shown in FIG. 12B, conductive particles 16 are inserted in the holes 15. Conductive particle 16 preferably has a particle diameter of a size that is at least greater than the thickness $t_{pc}$ (see FIG. 12H) of a passivation film 1a to cover the electrode 2 of the IC chip 1 and smaller than the thickness te (see FIG. 12H) of the electrode 5 of the board 4, and preferably is provided by a conductive particle 16 obtained by plating the surface of a resin ball 16a with gold as shown in FIG. 12F; or a conductive particle 17 obtained by plating the surface of a nickel particle 17a with gold 17b as shown in FIG. 12E; or a conductive particle 18 constructed of silver, silver-palladium, or gold itself as shown in FIG. 12G; or a conductive paste; or a particle comprised of a gold ball. Next, as shown in FIG. 12C, the electrodes 2 of the IC chip 1 are stuck to the electrodes 5 of the circuit board 4 through positional alignment, and thereafter the electrodes 2 of the IC chip 1 are aligned in position with the electrodes 5 of the circuit board 4. Similarly to the aforementioned embodiment, the IC chip 1 is pressed against the circuit board 4 by the heated bonding head 8 with ultrasonic wave vibrations applied to the IC chip 1 from an ultrasonic wave vibration generator connected to the head 8, by which the Al electrodes 2 of the IC chip 1 and the electrodes 5 of the circuit board 4 are bonded together via the metal on the surface of the conductive particle 16. At the same time, the thermosetting resin sheet 66 interposed between the IC chip 1 and the circuit board 4 is hardened to bond the IC chip 1 and the circuit board 4 together by the hardened resin 66s as shown in FIG. 12D. The surface of the electrode 5 of the circuit board 4 is preferably plated with gold. If the circuit board side is heated, the temperature of the bonding head 8 can be further lowered. In this case, the ultrasonic wave can break the oxide of the Al film on the pads of the IC chip 1 so as to expose pure Al. The temperature in the bonding stage can be lowered and Au—Al alloying can also be promoted. It is to be noted that the thermosetting adhesive or the anisotropic conductive film 10 can be used in place of the thermosetting resin sheet in the above embodiment, similarly to the foregoing embodiments.

A mounting method and apparatus according to a seventh embodiment of the present invention will be described next with reference to FIGS. 15A through 15G. This seventh embodiment is a mounting method and apparatus that executes leveling simultaneously with bonding.

Figure 15A:
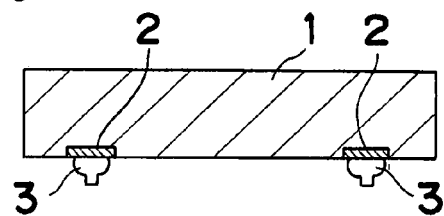
FIGS. 15A, 15B, 15C, 15D, 15E, 15F, and 15G are explanatory views showing a process for bonding an IC chip to a circuit board by a mounting method according to a seventh embodiment of the present invention.
Figure 15B:
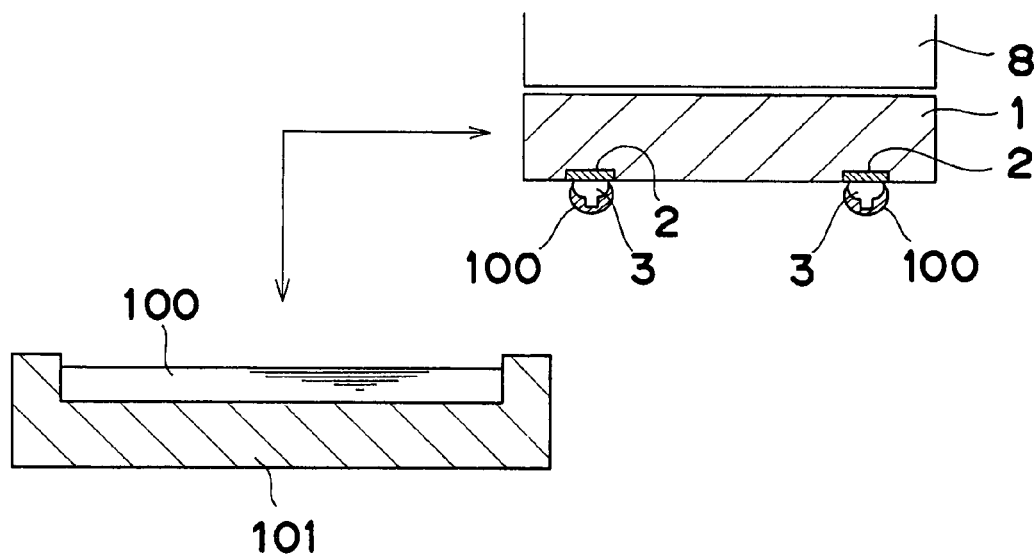
Figure 15C:
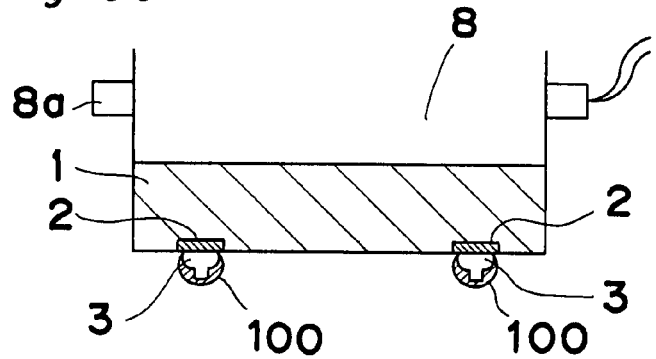
Figure 15D:
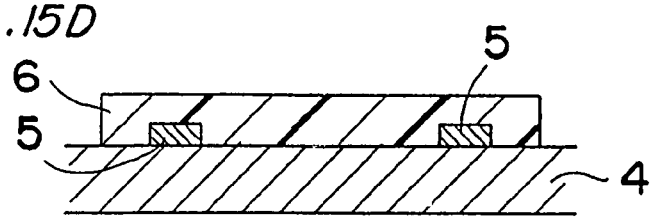
Figure 15E:
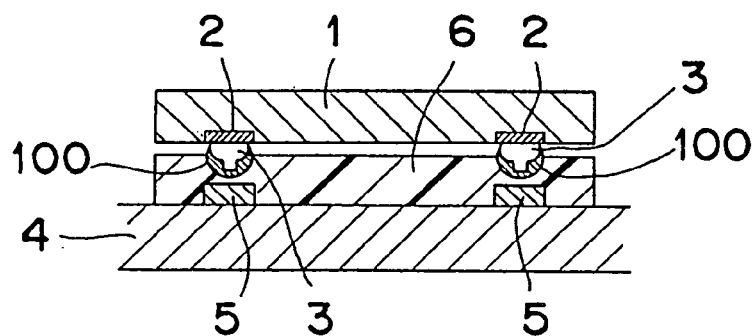
Figure 15F:
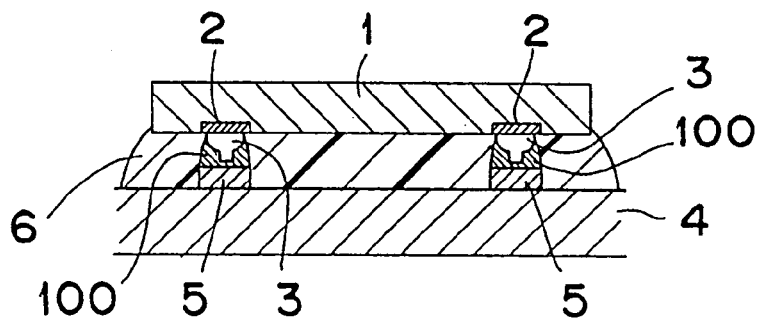
Figure 15G:
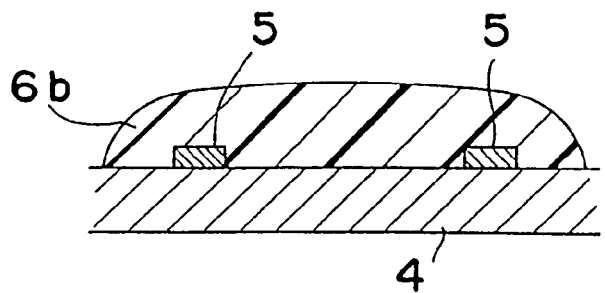

The bumps 3 formed on the electrodes 2 of the IC chip 1 shown in FIG. 15A are dipped in a conductive paste 100 in a conductive paste vessel 101 with the IC chip 1 held by the tool 8 as shown in FIG. 15B, the conductive paste 100 is made to adhere to the bumps 3 as shown in FIG. 15C. Subsequently, as shown in FIG. 15C, the conductive paste 100 is heated by the built-in heater 8a and hardened as shown in FIG. 15C, by which easier penetration through the thermosetting resin sheet 6 or the thermosetting adhesive 6b can be achieved in the next process. That is, this conductive paste 100 functions as part of the bumps 3. Subsequently, the IC chip 1 is pressed against the circuit board 4 as shown in FIG. 15E so that the bumps 3 are brought in contact with the electrodes 5 of the circuit board 4 on which the thermosetting resin sheet 6 shown in FIG. 15D is placed or the electrodes 5 of the circuit board 4 on which the thermosetting adhesive 6b shown in FIG. 15G is placed. Consequently, as shown in FIG. 15F, the bumps 3 and the electrodes 5 are electrically connected to each other via the conductive paste 100, or according to circumstances, the bumps 3 are electrically directly connected to the electrodes 5. By thus interposing the conductive paste 100, bumps 3 that are unevenly leveled can be connected to the electrodes 5. In this stage, the warp correction of the board 4 can be simultaneously achieved when bonding the IC chip 1 to the circuit board 4 with pressure by the heated bonding head 8, similarly to the foregoing embodiments. The conductive paste 100 can be provided by a variety of types as described hereinabove.

In the aforementioned various embodiments, the thermosetting adhesive can be used in place of the thermosetting resin sheet. The anisotropic conductive film 10 can also be used in place of the thermosetting adhesive. In this case, if nickel particles plated with gold are further used as the conductive particles included in the anisotropic conductive film 10, then the value of the connection resistance between the bump 3 and the electrode 5 can be further lowered, to a further advantage.

According to the present invention, a number of processes that have conventionally been necessary for bonding an electronic component such as an IC chip and a circuit board together can be eliminated, by which productivity is remarkably improved. In the case where a thermosetting resin sheet or a thermosetting adhesive having no conductive particle is used as the bonding material, an IC chip mounting method that is less expensive than the method described in connection with the second prior art example can be provided.

The following effects can also be produced.

(1) Bump Formation

According to the method for forming the bump with plating (third prior art example), the semiconductor manufacturers are required to perform special bump formation processes, meaning that only limited manufacturers can achieve bump formation. However, according to the method of the present invention, general IC chips for general-purpose wire-bonding can be used with the wire bonder, and this can facilitate the obtainment of IC chips.

In comparison with the method of the first prior art example, bump leveling for stabilizing the amount of transfer of the adhesive in an unstable transfer process for transferring a conductive adhesive can be eliminated, and this can obviate the need for the leveling device for such a leveling process.

According to the method of the fifth embodiment of the present invention, the bump formation on the IC chip can be eliminated, and this enables the provision of a mounting method that is simpler and inexpensive and has high productivity.

(2) Bonding of IC Chip to Circuit Board

According to the method of the second prior art example, the connection resistance has depended on the number of conductive particles existing between the bumps and the electrodes of the circuit board. However, according to the present invention, the electronic component is bonded by being pressed against the electrodes of the circuit board with a load greater than that of the first and second prior art examples without performing the leveling in the leveling process that serves as an independent process. Therefore, the connection resistance value does not depend on the number of interposed particles, so that the connection resistance value can be stably obtained.

The bump leveling is executed simultaneously with the bonding, and therefore, no independent leveling process is necessary. Furthermore, warps or undulations of the circuit board are deformed during bonding so as to execute correction with bonding, or the warp or undulation of the circuit board are deformed during bonding so as to execute correction with bonding without requiring the bump leveling by deforming the conductive paste during bonding through the hardening of the conductive paste applied to the bumps. Therefore, the method is tolerant of warps and undulations. It has been required to make uniform the board and the bumps with high accuracy as exemplified by 10 μm/IC (meaning that a thickness and warp dimensional accuracy of 10 μm is required per IC chip) of the first prior art example, 2 μm/IC of the second prior art example and 1 μm/IC (bump height variation of not larger than ±1 μm) of the third prior art example. Therefore, in practice, a glass board is used as represented by LCD. However, according to the method of the present invention, the resin board, flexible board, multilayer ceramic board, and the like can be employed as described in connection with the aforementioned embodiments, and this enables the provision of a low-cost general-purpose IC chip mounting method.

Furthermore, there is no need for providing the encapsulation resin (underfill coat) beneath the IC chip after the bonding of the IC chip to the circuit board with a conductive adhesive that has been necessary for the first prior art example, and this enables reduction of the required processes.

The holes 15 formed through the thermosetting resin sheet 66 preferably are formed at either the positions of the electrodes 2 of the IC chip 1 or the bumps 3 or the positions of the electrodes 5 of the circuit board 4. For example, if the number of the electrodes 5 of the circuit board 4 is greater than the number of the electrodes 2 of the IC chip 1, then it is proper to form the holes 15 corresponding to the number necessary for the bonding of the electrodes 2 of the IC chip 1, i.e., the positions and number of the electrodes 2 of the IC chip 1.

As described above, the present invention provides a method and apparatus for bonding an IC chip and a circuit board together, with a productivity superior to and less expensive than any one of the bonding methods that have conventionally existed.

The entire disclosure of Japanese Patent Application No. 8-350738 filed on Dec. 27, 1996, including specification, claims, drawings, and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of mounting an electronic component, said method comprising:
    aligning in position bumps formed by wire-bonding on electrodes of said electronic component with electrodes of a circuit board, with interposition between said electronic component and said circuit board of insulative solid thermosetting resin;
    softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board thereby bonding said electronic component and said circuit board together to achieve electrical connection between said mutual electrodes thereof; and
    said hardening, said leveling and said correcting being achieved at approximately the same time,
    wherein said thermosetting resin includes conductive particles.

2. The method as claimed in claim 1, wherein said particles comprise nickel particles plated with gold.

3. A method of mounting an electronic component, said method comprising:
    aligning in position bumps formed by wire-bonding on electrodes of said electronic component with electrodes of a circuit board, with interposition between said electronic component and said circuit board of insulative solid thermosetting resin;
    softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board, thereby bonding said electronic component and said circuit board together to achieve electrical connection between said mutual electrodes thereof; and
    said hardening, said leveling and said correcting being achieved at approximately the same time,
    wherein, prior to said aligning, said thermosetting resin, in the form of a solid thermosetting resin sheet having a shape dimension smaller than an outside dimension of connection between said electrodes of said electronic component, is applied to said circuit board, and said hardening with heat comprises applying said heat to said sheet, and
    wherein prior to said aligning, conductive adhesive is applied to said bumps.

4. A method of mounting an electronic component, said method comprising:
    aligning in position bumps formed by wire-bonding on electrodes of said electronic component with electrodes of a circuit board, with interposition between said electronic component and said circuit board of insulative solid thermosetting resin;
    softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board, thereby bonding said electronic component and said circuit board together to achieve electrical connection between said mutual electrodes thereof; and
    said hardening, said leveling and said correcting being achieved at approximately the same time, wherein, prior to said aligning, said thermosetting resin, in the form of a solid thermosetting resin sheet having holes formed at positions corresponding either to said bumps or to said electrodes of said circuit board and extending in a direction of extension of said bumps, with particles being embedded and electrically continuous in said holes, said particles comprising resin balls having surfaces plated with gold, nickel particles, conductive particles made of silver, silver-palladium or gold, conductive paste, or gold balls, is applied to said electrodes of said circuit board by positional alignment, and said bonding is executed by said hardening said sheet by application of heat thereto while conducting said pressing by forcing said electronic component toward said circuit board.

5. A method of mounting an electronic component, said method comprising:

aligning in position electrodes of said electronic component with electrodes of a circuit board, with interposition between said electronic component and said circuit board of insulative solid thermosetting resin;

softening to flow up to an edge of said electronic component, and then hardening, with heat, said thermosetting resin interposed between said electronic component and said circuit board, while achieving mutual pressing between said electronic component and said circuit board during correcting of any warping of said circuit board, thereby bonding said electronic component and said circuit board together to achieve electrical connection between said mutual electrodes thereof;

wherein, prior to said aligning, said thermosetting resin, in the form of a solid thermosetting resin sheet having holes formed at positions corresponding to said electrodes of said circuit board and extending in a direction of extension of said electrodes, with particles being embedded and electrically continuous in said holes, said particles comprising resin balls having surfaces plated with gold, nickel particles, conductive particles made of silver, silver-palladium or gold, conductive paste, or gold balls, is applied to said electrodes of said circuit board by positional alignment, and said bonding is executed by said hardening said sheet by application of heat thereto while conducting said pressing by forcing said electronic component toward said circuit board; and wherein each of said particles has a size greater than a thickness of a passivation film to be coated on at least said electrodes of said electronic component and smaller than a thickness of one of said electrodes of said circuit board, and said bonding further is executed by applying ultrasonic vibrations to said electronic component.

6. A method of mounting an electronic component, said method comprising:

aligning in position bumps formed by wire-bonding on electrodes of said electronic component with electrodes of a circuit board, with interposition between said electronic component and said circuit board of insulative solid thermosetting resin;

softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board, thereby bonding said electronic component and said circuit board together to achieve electrical connection between said mutual electrodes thereof;

said hardening, said leveling and said correcting being achieved at approximately the same time; and applying conductive paste to said bumps, hardening said conductive paste to function as part of said bumps, and, during said bonding, forcing the thus hardened conductive paste through said thermosetting resin and forming electrical connections between said hardened conductive paste and said electrodes of said circuit board.

7. A method of mounting an electronic component, said method comprising:

aligning in position bumps formed by wire-bonding on electrodes of said electronic component with electrodes of a circuit board, with interposition between said electronic component and said circuit board of insulative solid thermosetting resin;

softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board, thereby bonding said electronic component and said circuit board together to achieve electrical connection between said mutual electrodes thereof; and said hardening, said leveling and said correcting being achieved at approximately the same time, wherein said thermosetting resin comprises a thermosetting resin sheet having an anisotropic conductive film, and wherein said conductive film includes conductive nickel particles plated with gold.

8. The method according to claim 5, further comprising correcting any warping of said electronic component and leveling said bumps at approximately the same time as hardening said thermosetting resin and correcting any warping of said circuit board.

9. The method according to claim 5, wherein hardening said thermosetting resin comprises applying heat of from 140° C. to 230° C. for from about several seconds to twenty seconds.

10. The method according to claim 5, wherein said circuit board is selected from the group consisting of a multilayer ceramic board, a glass cloth base epoxy copper clad laminate board, an aramid unwoven fabric board, a glass cloth base polymide resin copper clad laminate board, and flexible printed circuit board.

11. The method according to claim 5, wherein hardening with heat said thermosetting resin while achieving the mutual pressing between said electronic component and said circuit board, during correcting of any warping of said circuit board, results in softening of said thermosetting resin.

12. The method according to claim 5, wherein aligning in position electrodes of said electronic component with electrodes of a circuit board comprises aligning said electrodes of said electronic component with said electrodes on said circuit board while holding said electronic component with a heated bonding tool, softening to flow up to an edge of said electronic component, and then hardening, with heat, said thermosetting resin interposed between said electronic component and said circuit board comprises transferring heat from said heated bonding tool to said thermosetting resin, and achieving mutual pressing between said electronic component and said circuit board comprises using said heated bonding tool to force said electronic component against said thermosetting resin.

13. A method of mounting an electronic component, said method comprising:

aligning in position bumps formed by wire-bonding on electrodes of said electronic component with electrodes of a circuit board, with interposition between said electronic component and said circuit board of insulative solid thermosetting resin;

softening to flow up to an edge of said electronic component, and then hardening, with heat, said thermosetting resin interposed between said electronic component and said circuit board, while achieving mutual pressing between said electronic component and said circuit board at a pressure of force of at least 20 gf per bump during leveling of said bumps and correcting of any warping of said circuit board, thereby bonding said electronic component and said circuit board together to achieve electrical connection between said mutual electrodes thereof; and said hardening, said leveling and said correcting being achieved at approximately the same time, wherein said solid thermosetting resin includes an inorganic filler.

14. The method according to claim 5, wherein said solid thermosetting resin includes an inorganic filler.

15. The method according to claim 5, wherein softening to flow up to an edge of said electronic component, and then hardening, with heat, said thermosetting resin, while achieving mutual pressing between said electronic component and said circuit board, comprises using a heated bonding tool to perform the mutual pressing.

16. The method according to claim 15, further comprising correcting any warping of said electronic component and leveling said bumps at approximately the same time as hardening said thermosetting resin and correcting any warping of said circuit board.

17. The method according to claim 15, wherein hardening said thermosetting resin comprises applying heat of from 140° C. to 230° C. for from about several seconds to twenty seconds.

18. The method according to claim 15, wherein said circuit board is selected from the group consisting of a multilayer ceramic board, a glass cloth base epoxy copper clad laminate board, an aramid unwoven fabric board, a glass cloth base polymide resin copper clad laminate board, and flexible printed circuit board.

19. The method according to claim 15, wherein hardening with heat said thermosetting resin while achieving the mutual pressing between said electronic component and said circuit board, during correcting of any warping of said circuit board, results in softening of said thermosetting resin.

20. The method according to claim 15, wherein aligning in position electrodes of said electronic component with electrodes of a circuit board comprises aligning said electrodes of said electronic component with said electrodes on said circuit board while holding said electronic component with said heated bonding tool, softening to flow up to an edge of said electronic component, and then hardening, with heat, said thermosetting resin interposed between said electronic component and said circuit board comprises transferring heat from said heated bonding tool to said thermosetting resin, and achieving mutual pressing between said electronic component and said circuit board comprises using said heated bonding tool to force said electronic component against said thermosetting resin.

21. The method according to claim 15, wherein said solid thermosetting resin includes an inorganic filler.

22. The method according to claim 1, wherein softening to flow up to an edge of said electronic component, and then hardening, with heat, said thermosetting resin, while achieving mutual pressing between said electronic component and said circuit board, comprises using a heated bonding tool to perform the mutual pressing.

23. The method according to claim 2, wherein softening to flow up to an edge of said electronic component, and then hardening, with heat, said thermosetting resin, while achieving mutual pressing between said electronic component and said circuit board, comprises using a heated bonding tool to perform the mutual pressing.

24. The method according to claim 3, wherein softening to flow up to an edge of said electronic component, and then hardening, with heat, said thermosetting resin, while achieving mutual pressing between said electronic component and said circuit board, comprises using a heated bonding tool to perform the mutual pressing.

25. The method according to claim 4, wherein softening to flow up to an edge of said electronic component, and then hardening, with heat, said thermosetting resin, while achieving mutual pressing between said electronic component and said circuit board, comprises using a heated bonding tool to perform the mutual pressing.

26. The method according to claim 6, wherein softening to flow up to an edge of said electronic component, and then hardening, with heat, said thermosetting resin, while achieving mutual pressing between said electronic component and said circuit board, comprises using a heated bonding tool to perform the mutual pressing.

27. The method according to claim 7, wherein softening to flow up to an edge of said electronic component, and then hardening, with heat, said thermosetting resin, while achieving mutual pressing between said electronic component and said circuit board, comprises using a heated bonding tool to perform the mutual pressing.

28. The method according to claim 13, wherein softening to flow up to an edge of said electronic component, and then hardening, with heat, said thermosetting resin, while achieving mutual pressing between said electronic component and said circuit board, comprises using a heated bonding tool to perform the mutual pressing.

* * * * *

UNITED STATES PATENT AND TRADEMARK OFFICE
CERTIFICATE OF CORRECTION

PATENT NO. : 6,981,317 B1
APPLICATION NO. : 09/331763
DATED : January 3, 2006
INVENTOR(S) : Kazuto Nishida It is certified that error appears in the above-identified patent and that said Letters Patent is hereby corrected as shown below:

IN THE SPECIFICATION

In column 20, line 8, change "board thereby" to --board, thereby--.

Claim 15

In column 23, line 32, insert a paragraph break after "wherein".

Signed and Sealed this

Twentieth Day of February, 2007

JON W. DUDAS
*Director of the United States Patent and Trademark Office*